(12) United States Patent
Ogawa et al.

(10) Patent No.: US 9,629,273 B2
(45) Date of Patent: Apr. 18, 2017

(54) DISPLAY DEVICE FOR VEHICLE, AND BICYCLE

(71) Applicants: PANASONIC CORPORATION, Kadoma-shi, Osaka (JP); HOSIDEN CORPORATION, Yao-shi, Osaka (JP)

(72) Inventors: Mitsuru Ogawa, Osaka (JP); Naoki Jinde, Osaka (JP); Hideaki Taketsu, Osaka (JP); Masaharu Mikawa, Osaka (JP)

(73) Assignees: PANASONIC CORPORATION, Osaka (JP); HOSIDEN CORPORATION, Osaka (JP)

( * ) Notice: Subject to any disclaimer, the term of this patent is extended or adjusted under 35 U.S.C. 154(b) by 0 days.

(21) Appl. No.: 14/914,539

(22) PCT Filed: Aug. 28, 2013

(86) PCT No.: PCT/JP2013/005065
§ 371 (c)(1),
(2) Date: Feb. 25, 2016

(87) PCT Pub. No.: WO2015/029085
PCT Pub. Date: Mar. 5, 2015

(65) Prior Publication Data
US 2016/0212874 A1    Jul. 21, 2016

(51) Int. Cl.
*G06F 1/16*    (2006.01)
*H05K 7/14*    (2006.01)
(Continued)

(52) U.S. Cl.
CPC ............... *H05K 7/14* (2013.01); *B62J 11/00* (2013.01); *B62J 99/00* (2013.01); *B62J 2099/0033* (2013.01)

(58) Field of Classification Search
CPC ..... B60R 1/00; B60R 2300/205; B60R 1/002; B60R 1/04; B62J 99/00; B62J 2099/0033;
(Continued)

(56) References Cited

U.S. PATENT DOCUMENTS 5,761,157 A    6/1998  Takeda et al.
2003/0160686 A1*   8/2003  Uno ................. B62J 99/00
340/432

(Continued)

FOREIGN PATENT DOCUMENTS

JP    11-297288 A    10/1999
JP    2000-16367 A    1/2000
(Continued)

OTHER PUBLICATIONS

International Search Report issued in PCT/JP2013/005065, Nov. 26, 2013.
(Continued)

*Primary Examiner* — Anthony Haughton
*Assistant Examiner* — Ingrid Wright
(74) *Attorney, Agent, or Firm* — Hamre, Schumann, Mueller & Larson, P.C.

(57) ABSTRACT

A display device includes a supporting member, and a display member detachably joined to the supporting member. The display member includes a first case 20, first connecting terminals 23, and a first joint surface 31. The supporting member includes a second case 36, second connecting terminals 38, and a second joint surface 40. The first case 20 has a terminal mounting hole 42 formed. The first connecting terminal 23 is inserted into the terminal mounting hole 42. The first case 20 has a first seal member 47 that seals a gap between the first connecting terminal 23 and the terminal mounting hole 42. The distal end of the first seal member 47 is exposed on the first joint surface 31,
(Continued)

comes into contact with the second joint surface 40, and surrounds the distal ends of the first and second connecting terminals 23 and 38 to each other.

9 Claims, 34 Drawing Sheets

(51) Int. Cl.
*B62J 99/00* (2009.01)
*B62J 11/00* (2006.01)

(58) Field of Classification Search
CPC ......... B62J 6/00; B62J 6/04; B62J 6/20; B62J 6/02; B62J 6/001; H05K 7/14; G06F 3/0416; G06F 3/03547; G06F 3/147; G06F 1/16; G06F 1/1632; G06F 1/184; G06F 1/1656; G06F 1/187; G06F 1/185; G06F 1/186; G04B 37/00; A61J 7/0481
USPC ............ 361/679.32, 679.01, 679.02, 679.09, 361/679.21, 679.26, 679.27; 368/10, 316, 368/317; 362/473
See application file for complete search history.

(56) References Cited

U.S. PATENT DOCUMENTS

2004/0220002 A1 11/2004 Guderzo
2005/0180150 A1 8/2005 Okada et al.

FOREIGN PATENT DOCUMENTS

| JP | 3373637 B2 | 11/2002 |
| JP | 2004-352222 A | 12/2004 |
| JP | 2005-225426 A | 8/2005 |
| JP | 2008-198806 A | 8/2008 |
| JP | 2009-59586 A | 3/2009 |
| JP | 2009-190534 A | 8/2009 |
| JP | 2009-205980 A | 9/2009 |
| WO | 2011/111000 A1 | 9/2011 |

OTHER PUBLICATIONS

Supplementary European Search Report issued in corresponding European Patent Application No. 13892448.5, Jul. 11, 2016.

\* cited by examiner

DISPLAY DEVICE FOR VEHICLE, AND BICYCLE

TECHNICAL FIELD

The present invention relates to a display device that displays a riding condition of a vehicle and a bicycle including the display device.

BACKGROUND ART

A conventional display device for this type of a vehicle is, for example, a display device 304 for an electric bicycle in FIG. 34. The display device 304 includes a supporting member 302 attached to a handle bar 301 for the electric bicycle and a display member 303 detachably joined to the supporting member 302. The display member 303 displays data including a traveling speed of the electric bicycle and a remaining battery life.

The display member 303 has a plurality of first connecting terminals 305 at the bottom of the display member 303. The supporting member 302 has a plurality of second connecting terminals 306 at the top of the supporting member 302. As indicated by solid lines in FIG. 34, the display member 303 attached to the supporting member 302 brings the first connecting terminals 305 into contact with the second connecting terminal 306. This electrically connects the display member 303 and the supporting member 302 via the first and second connecting terminals 305 and 306.

The above display device for a bicycle can be divided into the supporting member 302 and the display member 303. For example, Patent Literature 1 describes such a display device.

CITATION LIST

Patent Literature

Patent Literature 1: Japanese Patent No. 3373637

SUMMARY OF INVENTION

Technical Problem

In the conventional configuration, however, the electric bicycle traveling with the display member 303 attached to the supporting member 302 may allow entry of water such as rainwater into a gap between the display member 303 and the supporting member 302. As shown in FIG. 35, water W entering the gap may come into contact with the first and the adjacent first connecting terminals 305. Alternatively, as shown in FIG. 36, the water W may come into contact with the second and the adjacent second connecting terminals 306. In the case of a potential difference between the first and the adjacent first connecting terminals 305, unfortunately, the first connecting terminals 305 may be electrolytically etched by the water W in contact with the first connecting terminals 305. Similarly, the second connecting terminals 306 may be electrolytically etched by the water W in contact with the second connecting terminals 306. Moreover, the water W in contact with the connecting terminals described above may disadvantageously cause poor communications.

An object of the present invention is to provide a display device for a vehicle and a bicycle, the display device being capable of preventing electrolytic etching of connecting terminals and poor communications.

Solution to Problem

In order to attain the object, a first invention is a display device attached to a vehicle, including:

a supporting member attached to a fixed member of the vehicle; and a display member detachably joined to the supporting member, wherein the display member includes a first case, a first circuit board stored in the first case, and a plurality of first connecting terminals electrically connected to the first circuit board, the supporting member includes a second case, a second circuit board stored in the second case, and a plurality of second connecting terminals electrically connected to the second circuit board, the first case has a first joint surface that is joined to the second case, the second case has a second joint surface that is joined to the first joint surface of the first case, the first connecting terminal has a distal end that is exposed on the first joint surface and comes into contact with a distal end of the second connecting terminal when the display member is attached to the supporting member, one of the first and second cases has a plurality of terminal mounting holes formed, one of the first and second connecting terminals is inserted into the terminal mounting hole, one of the cases includes a seal member that seals a gap between the one of the connecting terminals and the terminal mounting hole, and the seal member has a distal end that is exposed on one of the first and second joint surfaces, comes into contact with the other joint surface, and surrounds the distal ends of the first and second connecting terminals in contact to each other.

With this configuration, when the display member is attached to the supporting member, the distal end of the seal member is exposed on one of the joint surfaces and comes into contact with the other joint surface so as to surround the distal end of the first connecting terminal and the distal end of the second connecting terminal in contact with the first connecting terminal to each other. Thus, the distal end of the first seal member seals a gap between the distal ends of the first and the adjacent first connecting terminals and also seals a gap between the distal ends of the second and the adjacent second connecting terminals.

If water enters a gap between the first joint surface of the display member and the second joint surface of the supporting member, this configuration can prevent the water from coming into contact with the distal ends of the first and the adjacent first connecting terminals and prevent the water from coming into contact with the distal ends of the second and the adjacent second connecting terminals.

Thus, electrolytic etching of the first and second connecting terminals can be prevented by a potential difference between the first and the adjacent first connecting terminals or a potential difference between the second and the adjacent second connecting terminals, thereby preventing the occurrence of defective operations and poor communications.

A display device for a vehicle according to a second invention, wherein the one of the cases is the first case, the one of the connecting terminals is the first connecting terminal, the one of the joint surfaces is the first joint surface, and the other joint surface is the second joint surface.

With this configuration, when the display member is attached to the supporting member, the distal end of the seal member is exposed from the first joint surface and comes into contact with the second joint surface so as to surround the distal end of the first connecting terminal and the distal end of the second connecting terminal in contact with the first connecting terminal to each other. Thus, the distal end of the first seal member seals a gap between the distal ends of the first and the adjacent first connecting terminals and also seals a gap between the distal ends of the second and the adjacent second connecting terminals.

A display device for a vehicle according to a third invention, wherein the display member slides in attaching and detaching directions along the first and second joint surfaces so as to be attached to and detached from the supporting member, and at least one of the first and second cases has a draining member that guides water entering a gap between the first joint surface and the second joint surface from the front of the display device in the attaching and detaching directions of the display member in a lateral direction to laterally discharge the water to the outside of the display device for a vehicle, the draining member being disposed in front of the first and second connecting terminals in a traveling direction.

If water enters a gap between the first joint surface of the display member and the second joint surface of the supporting member from the front in the attaching and detaching directions of the display member, the water is guided in a lateral direction by the draining member and is laterally discharged to the outside of the display device for a vehicle. This configuration can prevent the water from being retained in the gap between the first joint surface and the second joint surface, thereby further preventing electrolytic etching of the first and second connecting terminals and the occurrence of defective operations and poor communications.

A display device for a vehicle according to a fourth invention, wherein the display member has first engaging portions, the supporting member has second engaging portions, the first engaging portions are engaged with the second engaging portions in an attaching direction along which the display member is attached to the supporting member, and are detached from the second engaging portions in a detaching direction along which the display member is detached from the supporting member, and the first and second engaging portions are provided in pairs in the attaching and detaching directions.

The pairs of engaging portions are provided in the attaching and detaching directions. Thus, in the attachment and detachment of the display member to and from the supporting member, the moving (sliding) distance of the display member in the attaching and detaching directions can be shortened.

A display device for a vehicle according to a fifth invention, wherein the display member is capable of being fixed to the supporting member with a detachable fastener.

With this configuration, the attachment of the fastener can fix the display member to the supporting member, whereas the detachment of the fastener can release the display member from the supporting member.

A display device for a vehicle according to a sixth invention, wherein the first case contains a change-over switch, the first case has an operation button for externally operating the change-over switch, the first case contains a waterproof member that elastically seals a gap between the change-over switch and the operation button, the first case has a button mounting hole and a waterproof-member mounting hole formed, the button mounting hole and the first case internally communicate to each other through the waterproof-member mounting hole, the operation button is removably fit into the button mounting hole, the waterproof member is detachably fit into the waterproof-member mounting hole and transmits an operation of the operation button to the change-over switch, and the waterproof member has an anti-slip portion formed that prevents a position of the waterproof member fit into the waterproof-member mounting hole from shifting to outside of the waterproof-member mounting hole during assembly.

With this configuration, the waterproof member is fit into the waterproof-member mounting hole and then is bonded to the first case with an adhesive during assembly. When the waterproof member is bonded, the anti-slip portion prevents the waterproof member from shifting to the outside of the waterproof-member mounting hole. This keeps the waterproof member at a normal installation position, facilitating bonding with high accuracy.

After that, the operation button is fit into the button mounting hole. After the assembly, a press on the operation button elastically deforms the waterproof member so as to turn on or off the change-over switch.

A display device for a vehicle according to a seventh invention, wherein the display member has an external connection port that is connectable to other devices, the first case has a reclosable cap that detachably covers the external connection port, the cap has an arm portion that is inserted into the first case, the arm portion is inserted into the first case when the cap is closed, the arm portion is capable of being drawn from the first case when the cap is opened, the arm portion has a stopper portion, the first case contains a regulating member, the regulating member has a notch formed, the arm portion is removably inserted into the notch, the stopper portion is engaged with the regulating member so as to regulate a drawing amount of the arm portion to a predetermined drawing amount, the first case has a removal preventing member that prevents the arm portion from being removed from the notch, and the removal preventing member is externally attachable and detachable to and from the first case.

When the cap is opened, the arm portion is drawn out of the first case with the turning cap, facilitating the opening of the cap. At this point, the engagement of the stopper portion with the regulating member regulates the drawing amount of the arm portion to the predetermined drawing amount. This can prevent the arm portion from being removed out of the first case.

The removal preventing member is removed from the first case so as to separate the arm portion from the notch while the cap is opened. Since the restriction on the drawing amount of the arm portion is removed by separating the arm portion from the notch, allowing the arm portion to be drawn out of the first case and the cap to be removed from the first case. At this point, the removal preventing member can be removed from the outside of the first case and thus the removal and replacement of the cap do not need disassembling of the first case, facilitating the replacement of the cap.

A display device for a vehicle according to an eighth invention, wherein the second connecting terminal has a second connecting terminal for a power supply and a second connecting terminal for communications, the second connecting terminal for the power supply receives a higher voltage than a voltage of the second connecting terminal for communications, the second circuit board and the second connecting terminal for the power supply are electrically connected to each other via a power supply line, the second circuit board and the second connecting terminal for communications are electrically connected to each other via a communication line, the display member contains a magnetic-field generating member, the supporting member contains a switch that connects and disconnects the power supply line in response to a magnetic field generated from the magnetic-field generating member, the attachment of the display member to the supporting member closes the contact point of the switch, and the detachment of the display member from the supporting member opens the contact point of the switch.

With this configuration, when the display member is attached to the supporting member, the first connecting terminals come into contact with the second connecting terminals, a magnetic field generated from the magnetic-field generating member in the display member is applied to the switch so as to close the contact point of the switch. This connects the power supply line. Thus, electric power stored in a battery is supplied to the second connecting terminal for the power supply from the second circuit board through the power supply line and then is supplied to the first circuit board from the second connecting terminal for the power supply through the first connecting terminal for the power supply.

When the vehicle travels with the display member attached to the supporting member, the distal end of the first connecting terminal for the power supply and the distal end of the second connecting terminal for the power supply may be momentarily separated from each other by vibrations and so on. Even in this case, the contact point of the switch is closed to keep the connection of the power supply line, thereby reliably supplying the power of the battery from the second circuit board to the first circuit board through the first and second connecting terminals for the power supply.

When the display member is removed from the supporting member, a magnetic field generated from the magnetic-field generating member in the display member is not applied to the switch. This opens the contact point of the switch and interrupts the power supply line. Thus, power supply from the battery to the second connecting terminal for the power supply is interrupted so as to prevent loading of a high voltage to the second connecting terminal for the power supply. This can prevent electrolytic etching of the second connecting terminal for the power supply.

A ninth invention is a bicycle including the display device for a vehicle according to any one of the first to eighth inventions.

Advantageous Effects of Invention

As has been discussed, the present invention can prevent electrolytic etching of the first and second connecting terminals, thereby preventing the occurrence of defective operations and poor communications.

Furthermore, in the attachment and detachment of the display member to and from the supporting member, the moving (sliding) distance of the display member in the attaching and detaching directions can be shortened.

Moreover, the attachment of the fastener can fix the display member to the supporting member, whereas the detachment of the fastener from the supporting member can release the fixing of the display member to the supporting member.

Furthermore, the waterproof member is fit into the waterproof-member mounting hole and then is bonded to the first case with an adhesive during assembly. When the waterproof member is bonded, the stopper portion prevents the waterproof member from falling out of the waterproof-member mounting hole, facilitating the bonding operation.

The removal preventing member is removed from the first case so as to separate the arm portion from the notch while the cap is opened. This can lift the restriction on the drawing amount of the arm portion so as to draw the arm portion out of the first case, allowing replacement of the cap. At this point, the removal preventing member can be removed from the outside of the first case and thus the replacement of the cap does not need disassembling of the first case, facilitating the replacement of the cap.

When the vehicle travels with the display member attached to the supporting member, the distal end of the first connecting terminal for the power supply and the distal end of the second connecting terminal for the power supply may be momentarily separated from each other by vibrations and so on. Even in this case, the contact point of the switch is closed to keep the connection of the power supply line, thereby reliably supplying the power of the battery from the second circuit board to the first circuit board through the first and second connecting terminals for the power supply.

When the display member is removed from the supporting member, the contact point of the switch is opened to interrupt the power supply line. Thus, power supply from the battery to the second connecting terminal for the power supply is interrupted so as to prevent loading of a high voltage to the second connecting terminal for the power supply. This can prevent electrolytic etching of the second connecting terminal for the power supply.

BRIEF DESCRIPTION OF DRAWINGS

FIG. 22(a) shows a state before a waterproof member is fit into a waterproof-member mounting hole, and FIG. 22(b) shows a state in which the waterproof member is fit into the waterproof-member mounting hole.

DESCRIPTION OF EMBODIMENT

An embodiment of the present invention will be described below with reference to the accompanying drawings.

Figure 1:
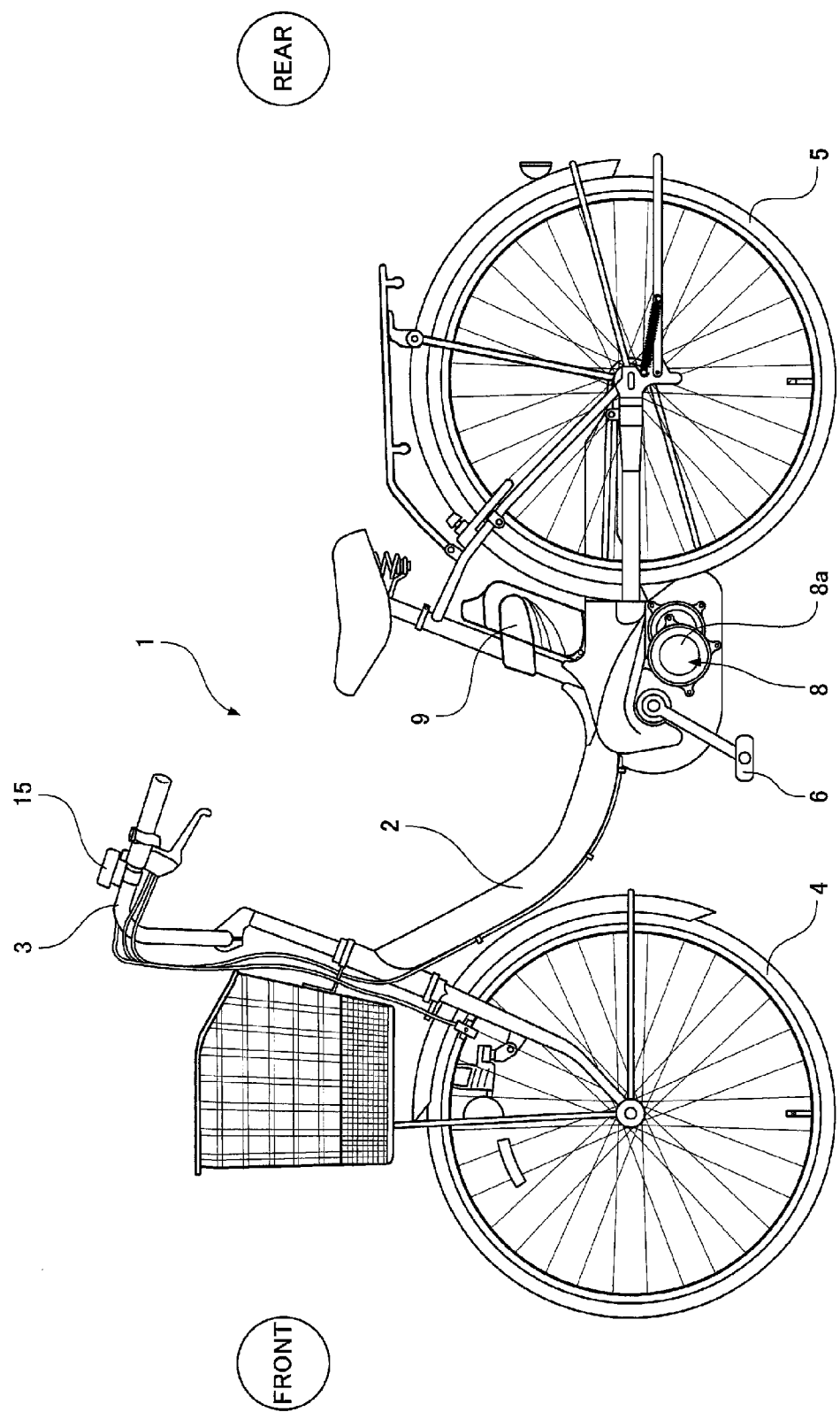
FIG. 1 is a side view showing a bicycle according to an embodiment of the present invention.

As shown in FIG. 1, reference numeral 1 denotes an electric bicycle, an example of a vehicle. The electric bicycle 1 includes a frame 2, a handle bar 3, a front wheel 4, a rear wheel 5, a chain (not shown) for transmitting a pedal force from a pedal 6 to the rear wheel 5, an electric auxiliary drive unit 8 that applies an auxiliary driving force to the chain, and a battery 9 that supplies power to the auxiliary drive unit 8. The auxiliary drive unit 8 includes a motor 8a and a speed reducer.

Figure 2:
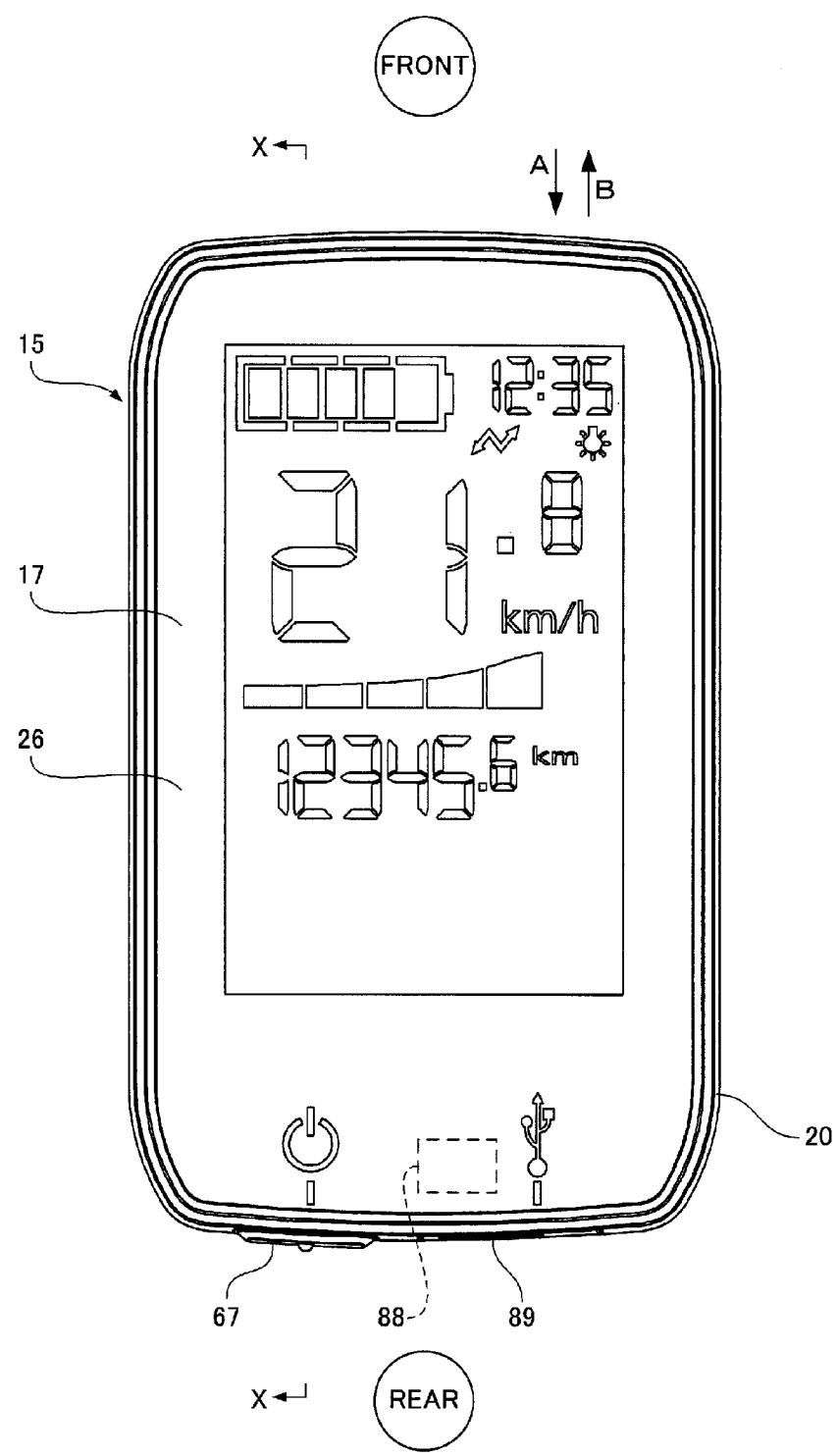
FIG. 2 is a plan view showing a display device attached to the bicycle according to an embodiment of the present invention.
Figure 3:
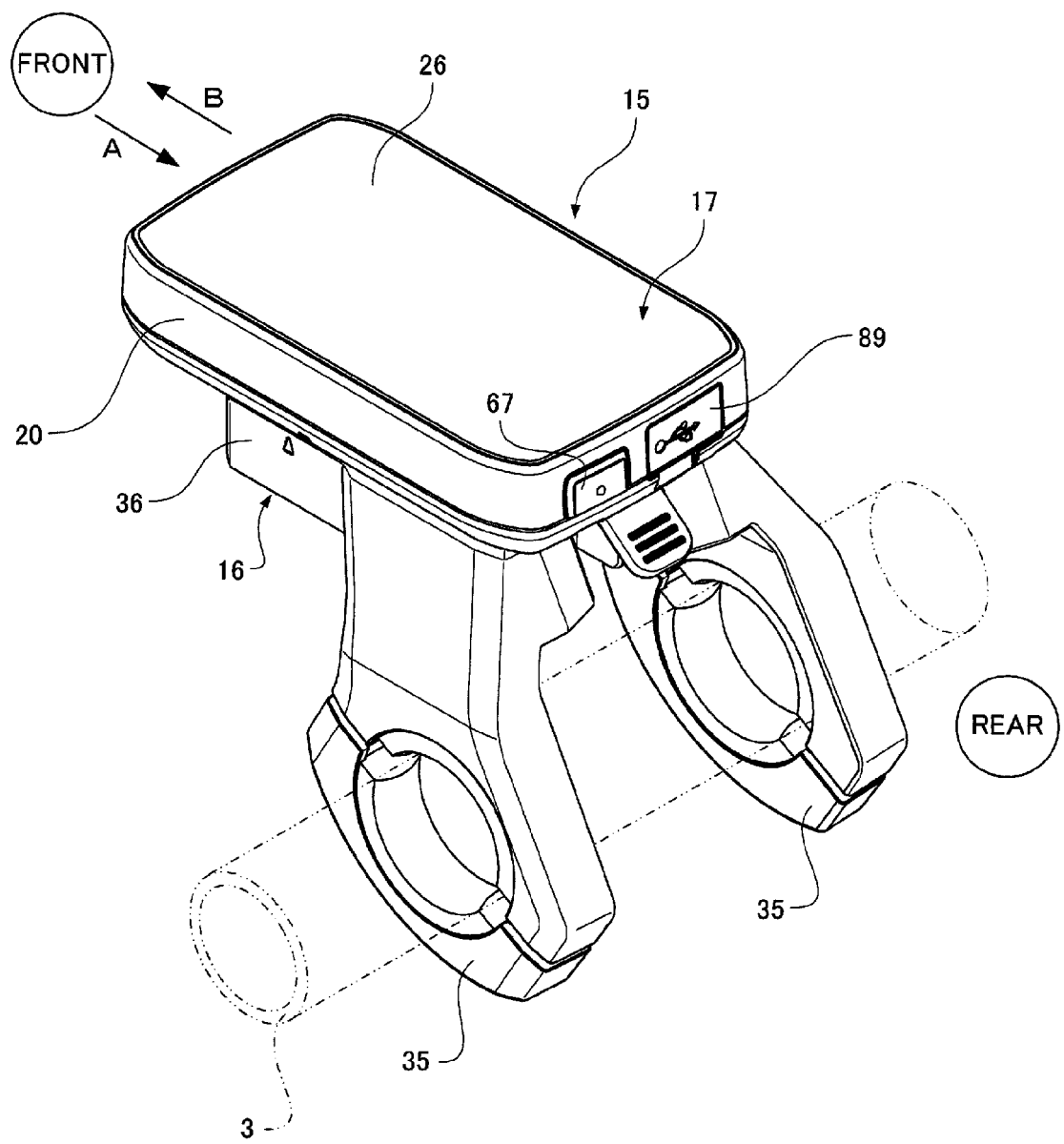
FIG. 3 is a perspective view showing the display device with the display member attached to a supporting member according to an embodiment of the present invention.
Figure 4:
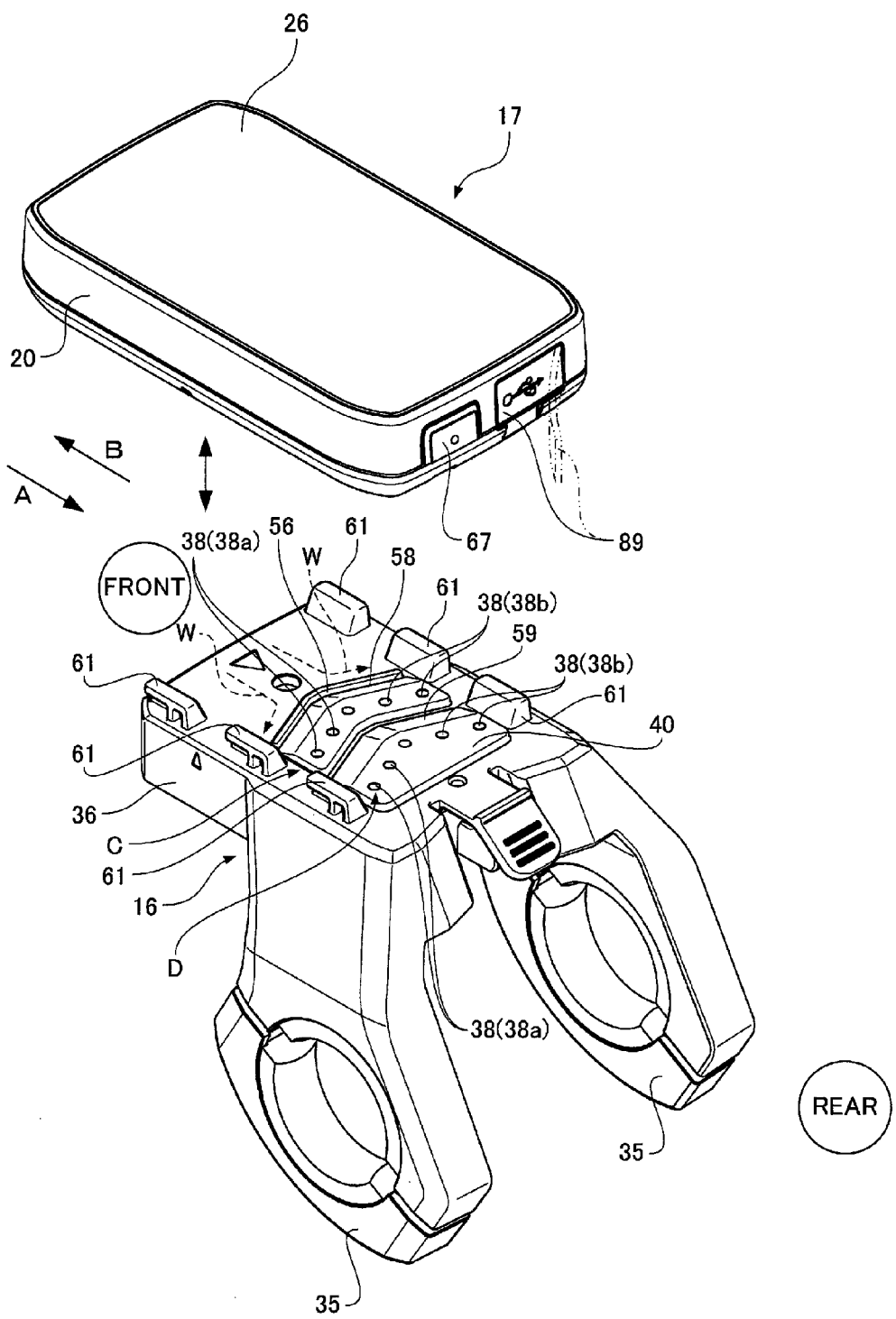
FIG. 4 is a perspective view showing the display device with the display member removed from the supporting member, according to an embodiment of the present invention.

As shown in FIGS. 1 and 2, the electric bicycle 1 has a display device 15 that is attached thereto to display various kinds of information, for example, a traveling speed, a travel distance, a time, a remaining life of the battery 9, and an assist mode. As shown in FIGS. 3 and 4, the display device 15 includes a supporting member 16 that is attached to the handle bar 3 (an example of a fixing member) and a display member 17 that is detachably joined to the supporting member 16.

Figure 5:
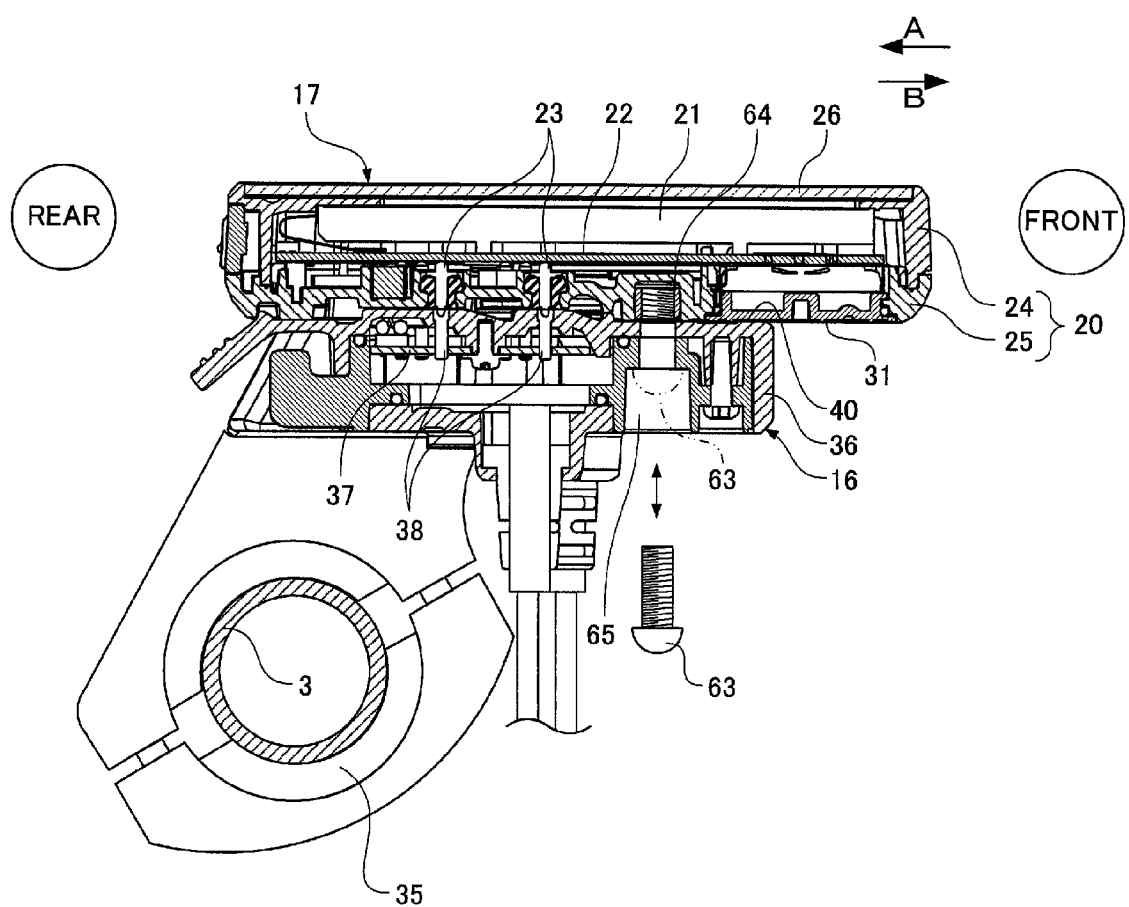
FIG. 5 is a longitudinal section of the display device according to an embodiment of the present invention.
Figure 6:
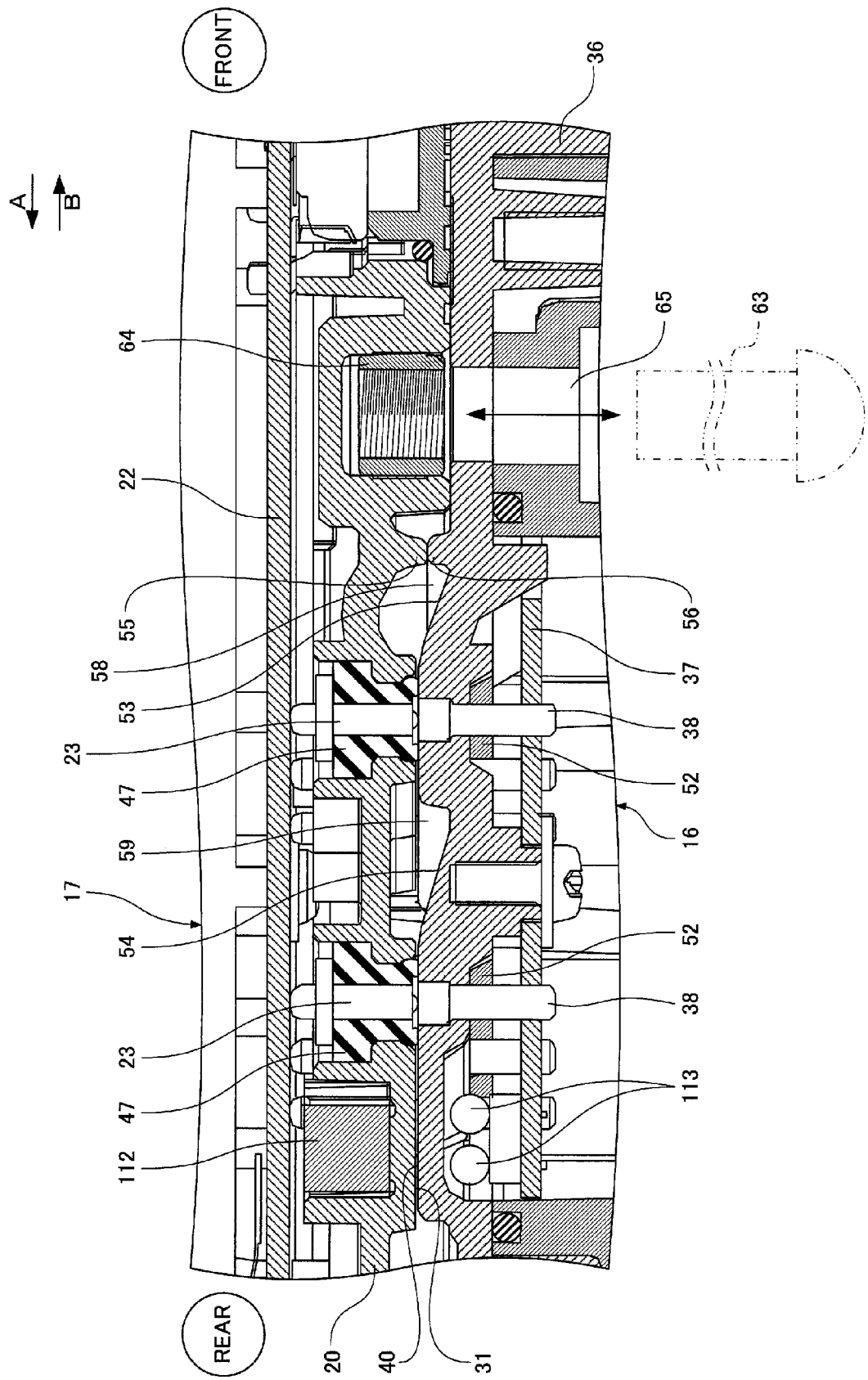
FIG. 6 is an enlarged view showing a part of the longitudinal section of FIG. 5.
Figure 7:
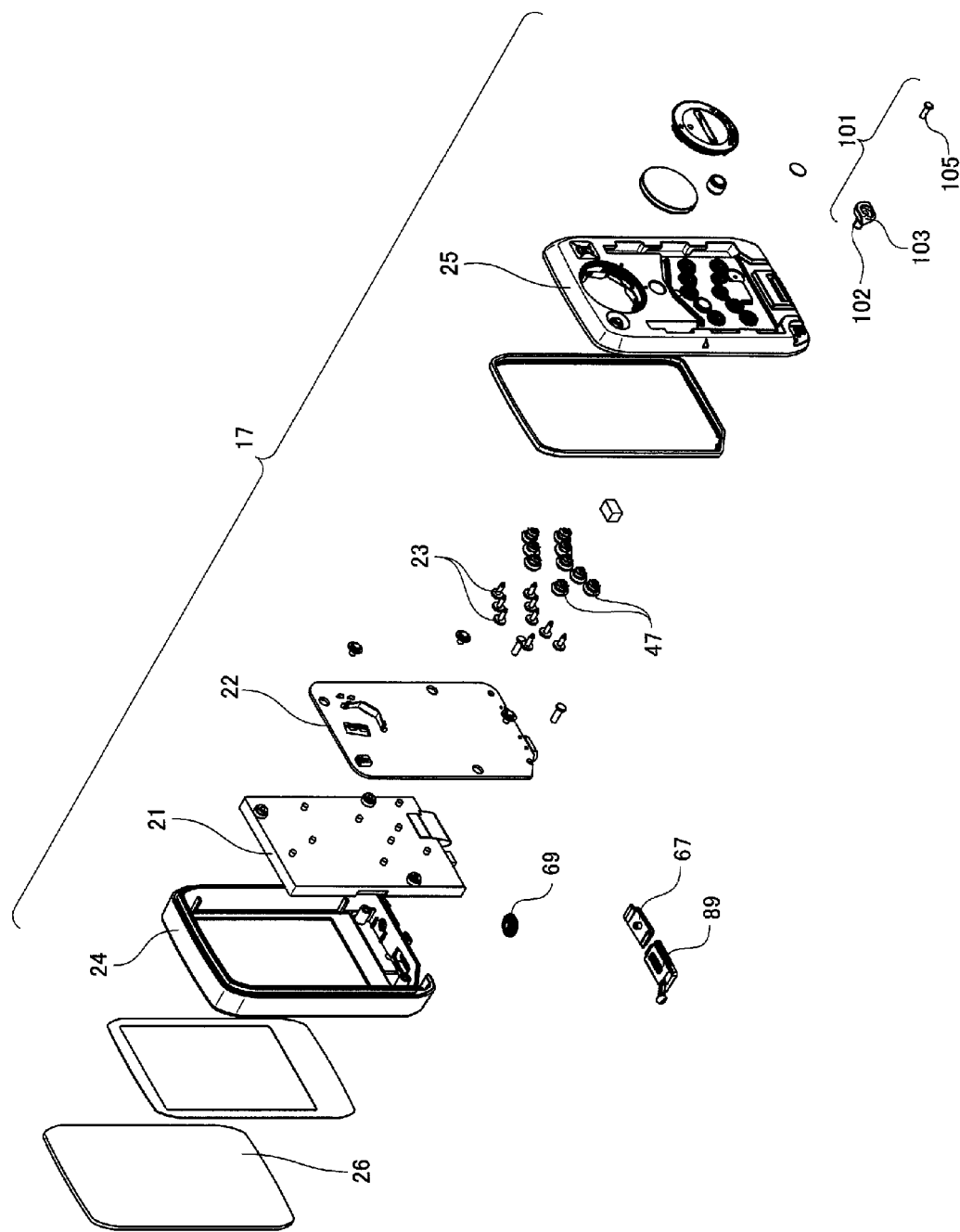
FIG. 7 is an exploded perspective view showing the display member of the display device according to an embodiment of the present invention.

As shown in FIGS. 5 to 7, the display member 17 includes a first case 20 (an example of one case), a liquid-crystal screen unit 21, a first circuit board 22, and a plurality of first connecting terminals 23 (an example of one connecting terminal) electrically connected to the first circuit board 22. The first case 20 is divided into an upper case unit 24 and a lower case unit 25. The upper case unit 24 and the lower case unit 25 are connected with a plurality of screws. Moreover, the upper case unit 24 and the lower case unit 25 may be bonded with an adhesive.

The upper case unit 24 has a glass or resin transparent plate 26 at the top of the upper case unit 24. The first circuit board 22 is held in the first case 20. The liquid-crystal screen unit 21 is provided on the first circuit board 22 and is stored in the first case 20.

Figure 8:
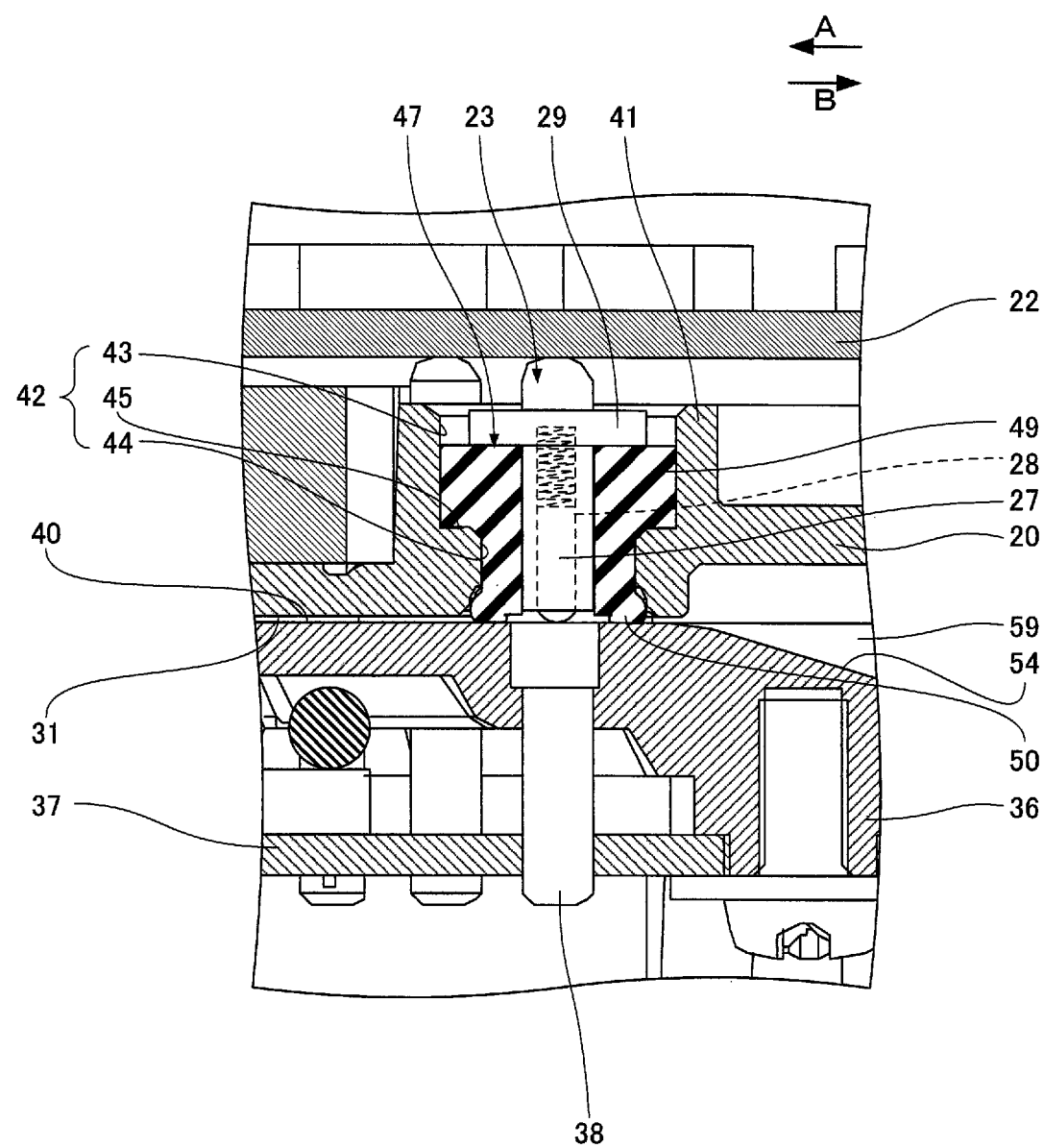
FIG. 8 is an enlarged longitudinal section showing the vicinity of first and second connecting terminals in the display device according to an embodiment of the present invention.
Figure 9:
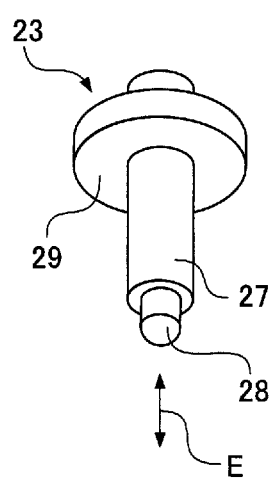
FIG. 9 is a perspective view showing the first connecting terminal of the display device according to an embodiment of the present invention.

As shown in FIGS. 8 and 9, the first connecting terminal 23 has an external cylinder 27, a pin 28 removably inserted into the external cylinder 27, a spring stored in the external cylinder 27, and a disc-like flange portion 29 provided at the top of the external cylinder 27. The spring urges the pin 28 downward so as to protrude the distal end (lower end) of the pin 28 below the external cylinder 27. The flange portion 29 radially extends to the outside of the external cylinder 27.

As shown in FIGS. 5 and 6, the supporting member 16 includes an annular mount 35, a second case 36, a second circuit board 37 stored in the second case 36, and a plurality of second connecting terminals 38 electrically connected to the second circuit board 37.

The first case 20 has a first joint surface 31 (an example of one joint surface) joined at the bottom of the first case 20 to the second case 36. The second case 36 has a second joint surface 40 (an example of the other joint surface) joined at the top of the second case 36 to the first joint surface 31 of the first case 20.

The display member 17 slides in attaching and detaching directions A and B (corresponding to the longitudinal direction) along the first and second joint surfaces 31 and 40 so as to be attached to and detached from the supporting member 16.

Figure 10:
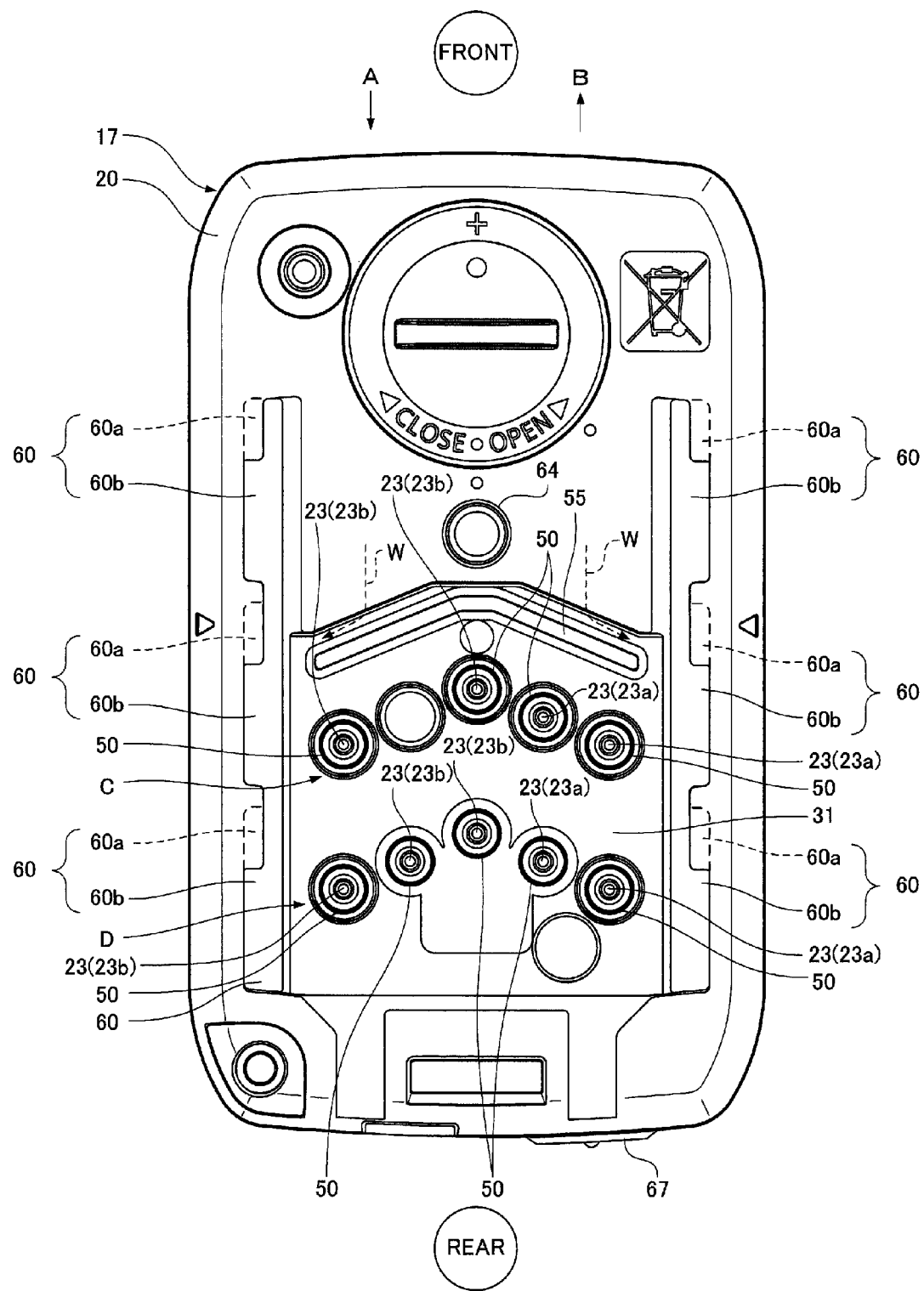
FIG. 10 is a bottom (underside) view showing the display member of the display device according to an embodiment of the present invention.

As shown in FIG. 10, the distal ends (lower end) of the first connecting terminals 23 are exposed at the first joint surface 31. As shown in FIG. 4, the distal ends (upper ends) of the second connecting terminals 38 are exposed at the second joint surface 40. The first and second connecting terminals 23 and 38 are disposed in a front row C and a rear row D, respectively. If the display member 17 is attached to the supporting member 16, as shown in FIGS. 5, 6, and 8, the distal ends of the first connecting terminals 23 come into contact with the distal ends of the second connecting terminals 38, electrically connecting the first circuit board 22 and the second circuit board 37 via the first and second connecting terminals 23 and 38.

As shown in FIG. 8, the first case 20 contains a plurality of boss portions 41 formed. The boss portion 41 has a terminal mounting hole 42 formed penetrating the inside and the outside of the first case 20. The terminal mounting hole 42 has a large diameter portion 43 at the top of the terminal mounting hole 42 and a small diameter portion 44 at the bottom of the terminal mounting hole 42. Moreover, a stepped surface 45 orthogonal to an axial direction E of the first connecting terminal 23 is formed at the boundary between the large diameter portion 43 and the small diameter portion 44.

The first connecting terminal 23 is inserted into the terminal mounting hole 42. A first seal member 47 (an example of a seal member) is fit into the terminal mounting hole 42 so as to seal a gap between the first connecting terminal 23 and the inner surface of the terminal mounting hole 42.

Figure 11:
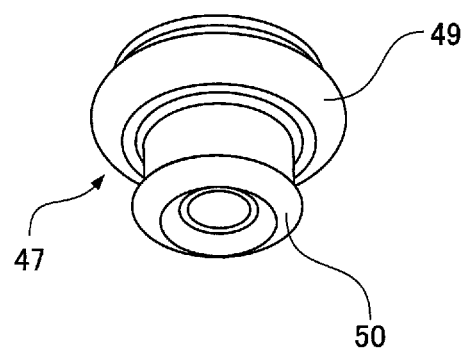
FIG. 11 is a perspective view showing a first seal member for the display device according to an embodiment of the present invention.

As shown in FIGS. 8 and 11, the first seal member 47 is a cylindrical member made of elastic materials such as silicone rubber. The first seal member 47 has an expanded portion 49 radially extending outward in the upper part of the first seal member 47 and an end protrusion 50 (an example of an end portion) extending downward at the lower end of the first seal member 47. The expanded portion 49 is fit into the large diameter portion 43 of the terminal mounting hole 42 and is held between the flange portion 29 of the first connecting terminal 23 and the stepped surface 45 of the terminal mounting hole 42 in the axial direction E.

As shown in FIG. 10, the end protrusions 50 of the first seal members 47 are exposed on the first joint surface 31.

When the display member 17 is attached to the supporting member 16, as shown in FIG. 8, the end protrusion 50 of the first seal member 47 comes into contact with the second joint surface 40 from above so as to surround the distal end of the first connecting terminal 23 and the distal end of the second connecting terminal 38.

As shown in FIG. 6, the second case 36 contains a second seal member 52 that prevents entry of water into the second case 36 from a gap between the second connecting terminal 38 and the second case 36.

Figure 12:
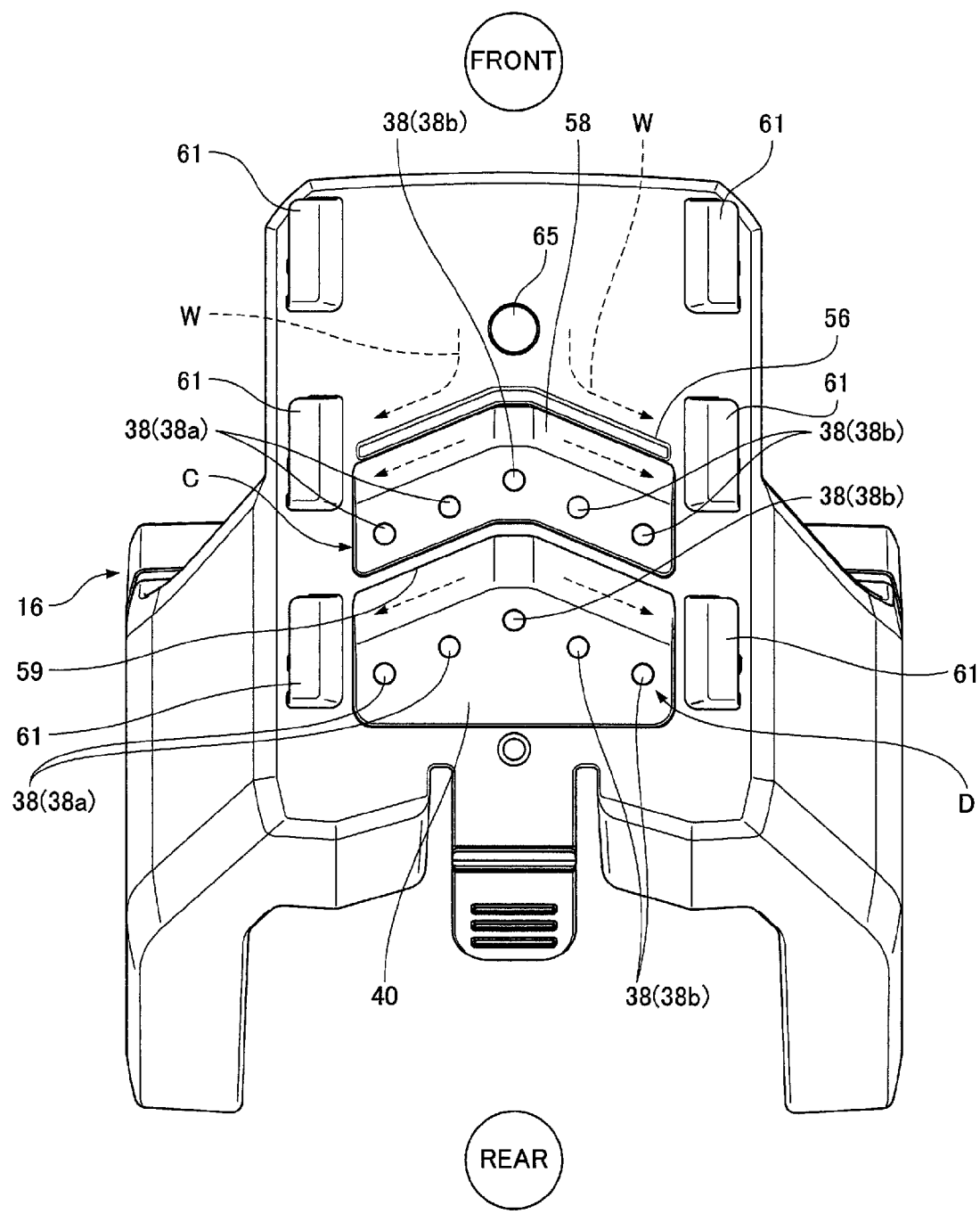
FIG. 12 is a plan view showing the supporting member of the display device according to an embodiment of the present invention.

As shown in FIGS. 6 and 10, the first joint surface 31 has a first drain wall 55 (an example of a draining member). As shown in FIGS. 4, 6, and 12, the second joint surface 40 has a second drain wall 56 (an example of a draining member). The first and second drain walls 55 and 56 guide water W entering a gap between the first joint surface 31 and the second joint surface 40 from the front in the attaching and detaching directions A and B (the traveling direction of the bicycle) of the display member 17 in a lateral direction to laterally discharge the water to the outside of the display device 15 for the bicycle. The first and second drain walls 55 and 56 are shaped like mountains (inverted V shapes) with the right and left ends inclined rearward.

As shown in FIG. 10, the first drain wall 55 protrudes downward from the first joint surface 31 and is disposed in front of the first connecting terminals 23 of the front row C in the attaching and detaching directions A and B. As shown in FIG. 12, the second drain wall 56 protrudes upward from the second joint surface 40 and is disposed in front of the second connecting terminals 38 of the front row C in the attaching and detaching directions A and B. As shown in FIG. 6, the display member 17 attached to the supporting member 16 locates the first drain wall 55 directly above the second drain wall 56.

As shown in FIGS. 4, 6, and 12, a plurality of drain grooves 58 and 59 (an example of a draining member) are formed on the second joint surface 40 so as to guide the water W entering the gap between the first joint surface 31 and the second joint surface 40 from the front in a lateral direction to laterally discharge the outside of the display device 15 for the bicycle. The drain grooves 58 and 59 are shaped like mountains (inverted V shapes) with the right and left ends inclined rearward. The front drain groove 58 is disposed between the second drain wall 56 and the second connecting terminals 38 of the front row C in the longitudinal direction. The rear drain groove 59 is disposed between the second connecting terminals 38 of the front row C and the second connecting terminals 38 of the rear row D in the longitudinal direction.

As shown in FIGS. 6 and 8, inclined surfaces 53 and 54 continuing to the second joint surface 40 are formed in the drain grooves 58 and 59.

Figure 13:
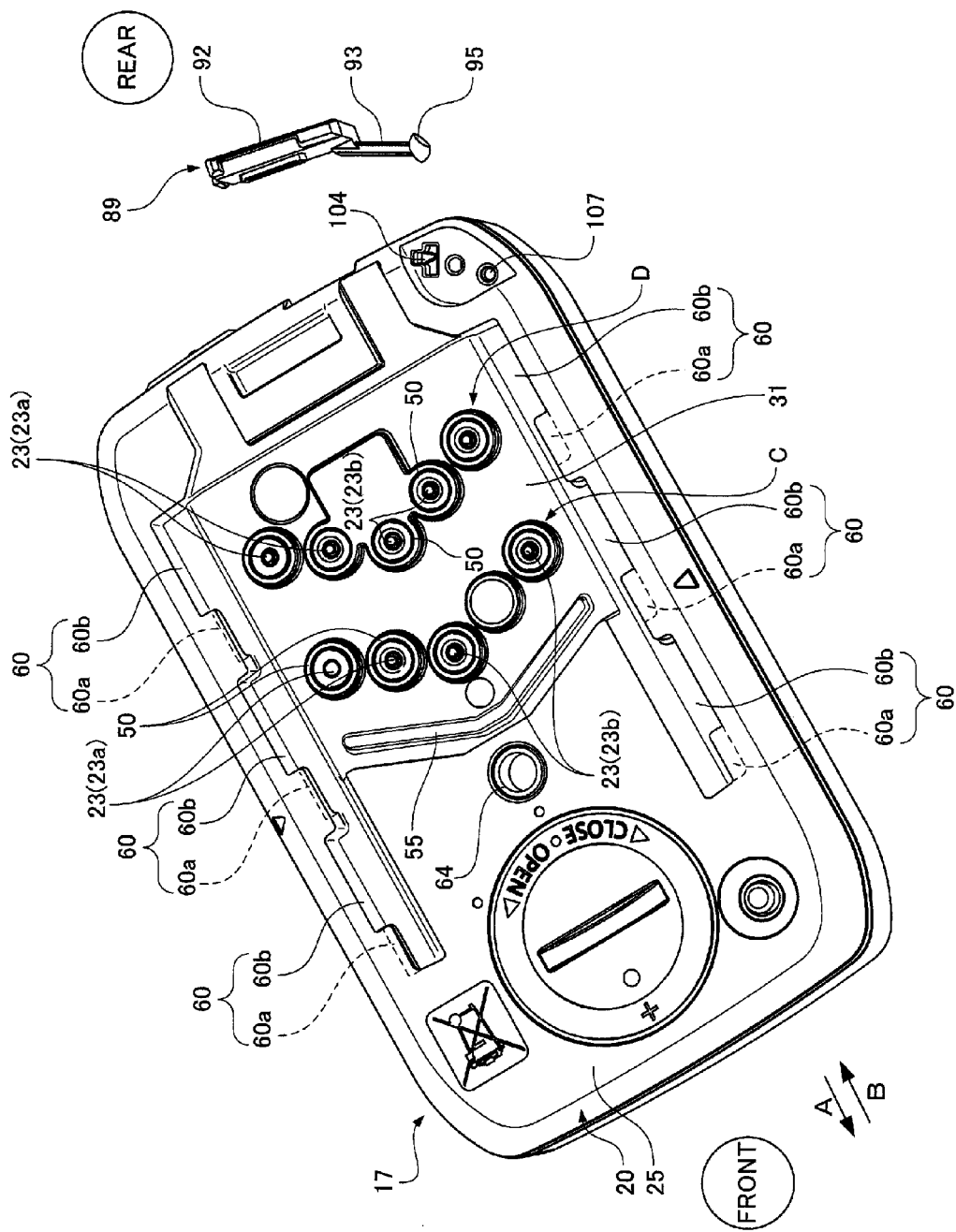
FIG. 13 is a perspective view showing the display member of the display device from the bottom side according to an embodiment of the present invention.
Figure 14:
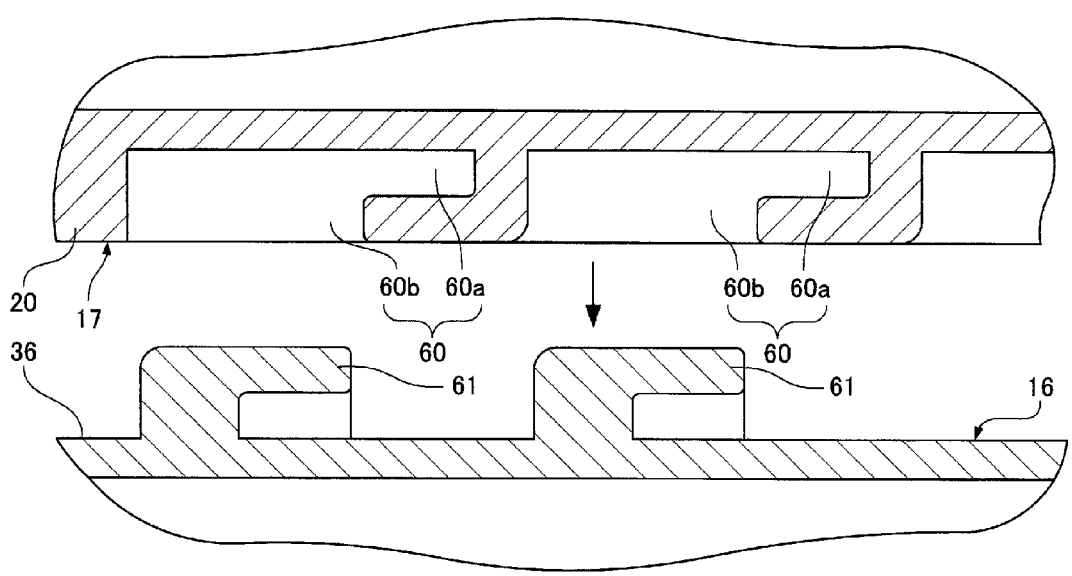
FIG. 14 is an enlarged cross-sectional view showing engaging holes and engaging claws in the display device, the engaging claws being removed below the engaging holes according to an embodiment of the present invention.

As shown in FIGS. 10, 13, and 14, engaging holes 60 (an example of a first engaging portion) are provided on the underside of the first case 20 of the display member 17. The engaging hole 60 has an insertion hole portion 60a formed inside the first case 20 and an opening portion 60b that communicates with the insertion hole portion 60a and is opened on the underside of the first case 20. As shown in FIGS. 4, 12, and 14, engaging claws (an example of a second engaging portion) are provided on the top surface of the second case 36 of the supporting member 16.

Figure 15:
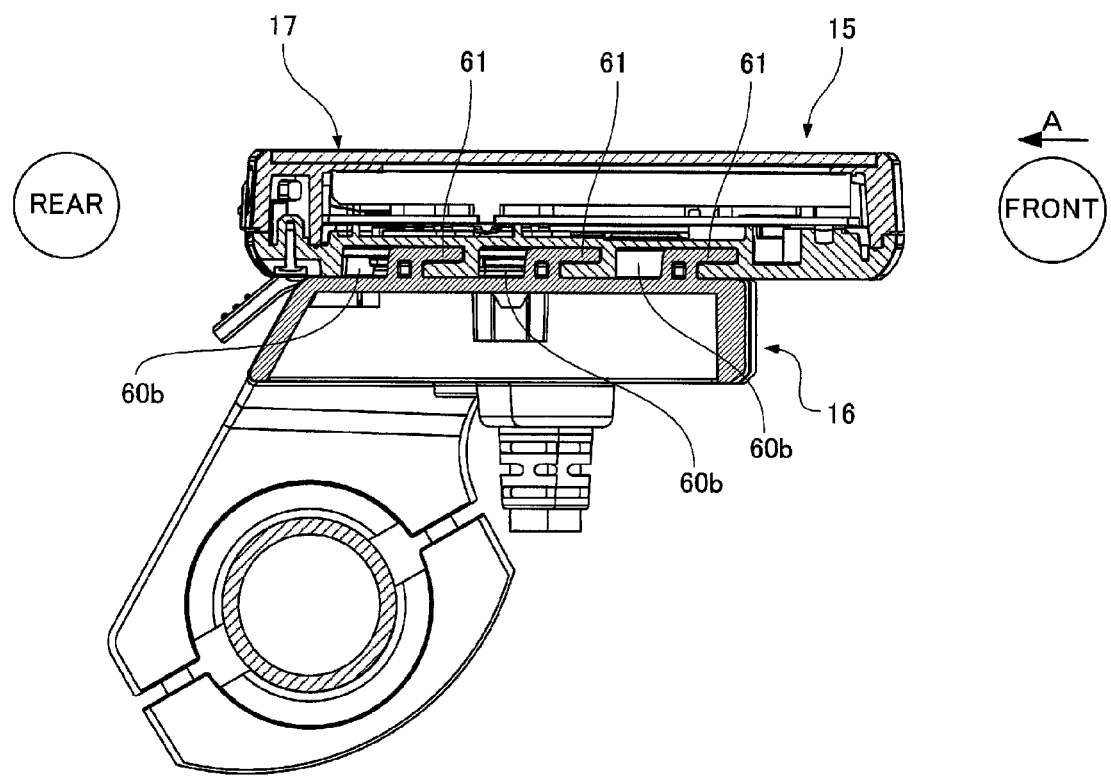
FIG. 15 is a longitudinal section showing that the display member of the display device is attached to the supporting member with the engaging claws engaged with the engaging holes according to an embodiment of the present invention.
Figure 16:
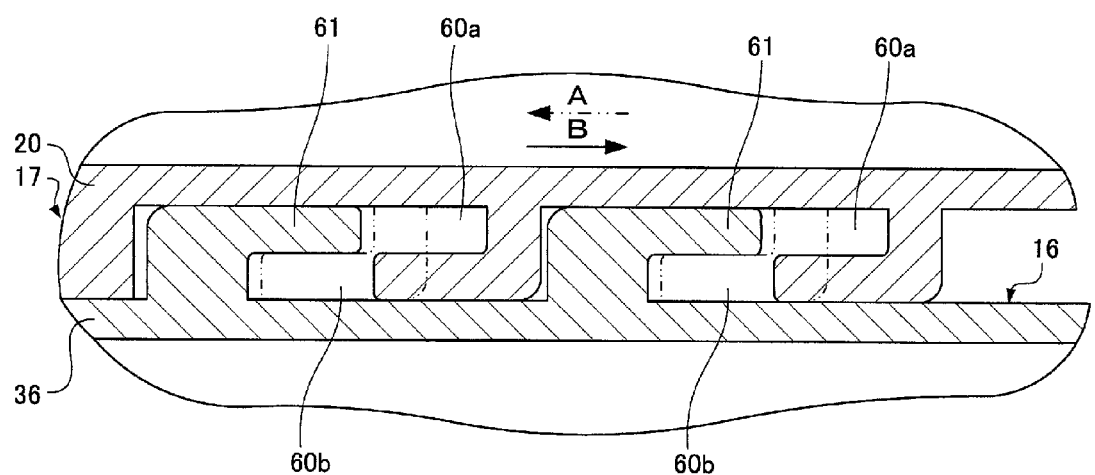
FIG. 16 is an enlarged cross-sectional view showing the engaging holes and the engaging claws of the display device, the engaging claws being inserted into the engaging holes according to an embodiment of the present invention.

As shown in FIG. 15 and indicated by virtual lines in FIG. 16, the engaging hole 60 is engaged with the engaging claw 61 in the attaching direction A (from the front to the rear) along which the display member 17 is attached to the supporting member 16. As indicated by solid lines in FIG. 16 and shown in FIG. 17, the engaging hole 60 is disengaged from the engaging claw 61 in the detaching direction B (from the rear to the front) along which the display member 17 is detached from the supporting member 16. As shown in FIG. 15 and indicated by the virtual lines in FIG. 16, the engagement of the engaging hole 60 with the engaging claw 61 inserts the engaging claw 61 into the insertion hole portion 60a from the opening portion 60b. As indicated by the solid lines in FIG. 16 and shown in FIG. 17, the disengagement of the engaging hole 60 from the engaging claw 61 removes the engaging claw 61 from the insertion hole portion 60a. As shown in FIG. 14, the engaging claw 61 is removed below the first case 20 from the opening portion 60b.

As shown in FIGS. 4 and 13, the engaging hole 60 and the engaging claw 61 are paired in the width direction (lateral direction) and three (multiple) pairs of the engaging holes or claws are provided in the attaching and detaching directions A and B (longitudinal direction).

As shown in FIGS. 5 and 6, the display member 17 can be fixed to the supporting member 16 with a detachable screw 63 (an example of a fastener). The first case 20 of the display member 17 has a nut member 64 that is exposed on the first joint surface 31. The second case 36 of the supporting member 16 has a screw hole 65 that vertically penetrates the second case 36. The display member 17 attached to the supporting member 16 locates the nut member 64 directly above the screw hole 65.

Figure 18:
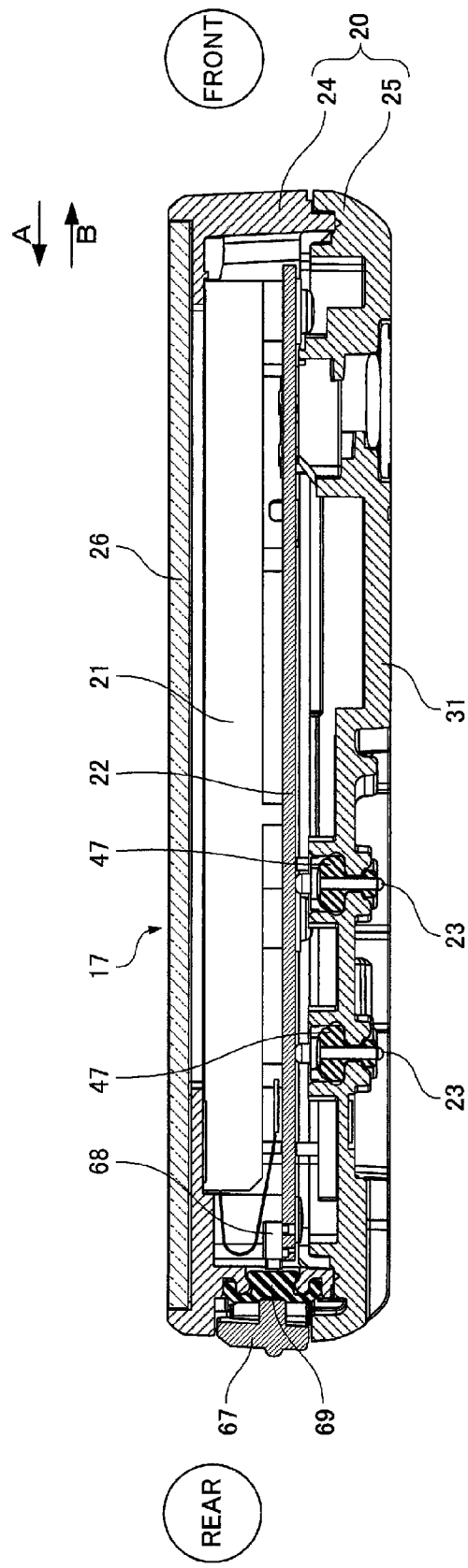
FIG. 18 is a view on arrow taken along line X-X of FIG. 2.
Figure 19:
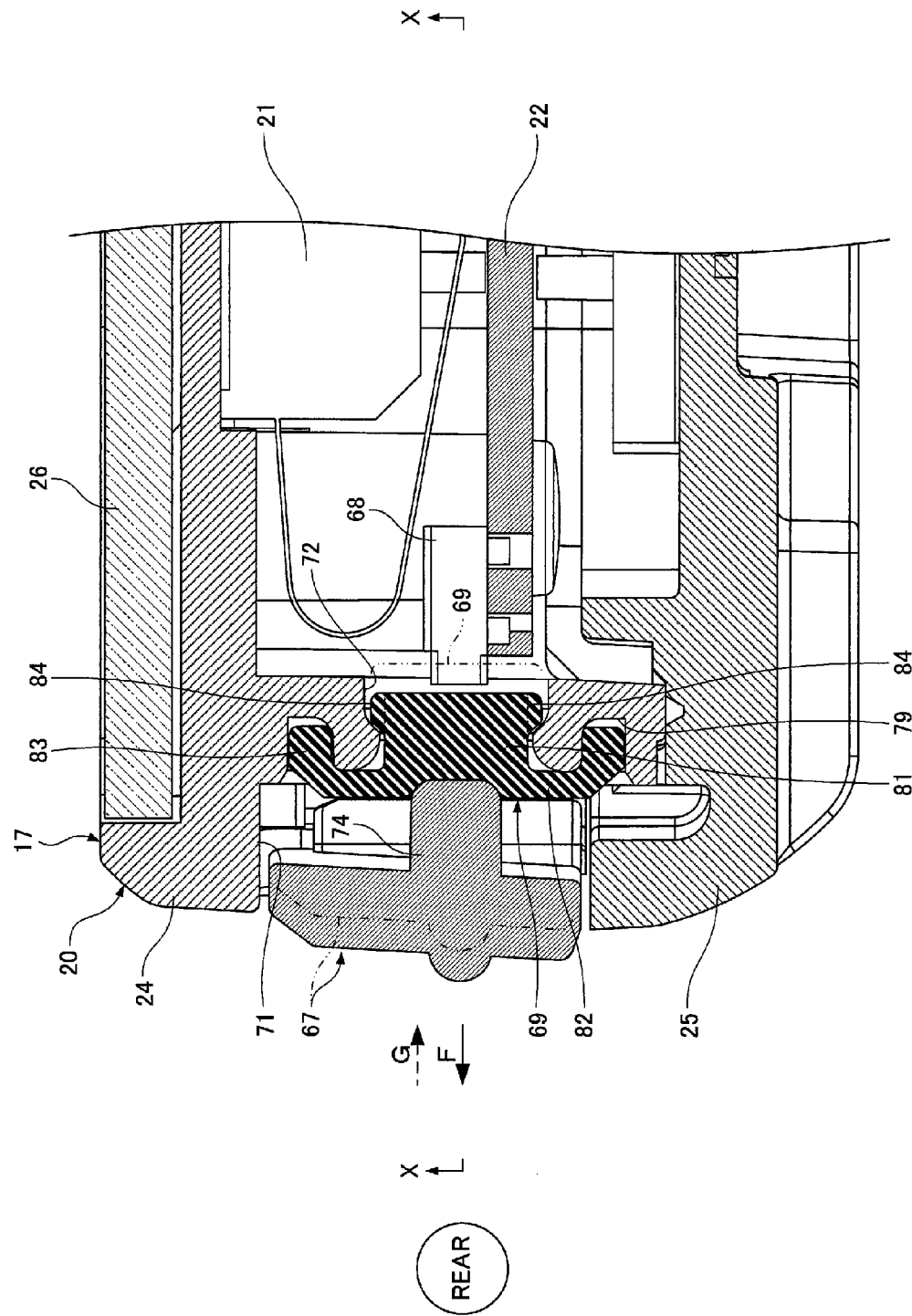
FIG. 19 is a partially enlarged longitudinal section of FIG. 18.
Figure 20:
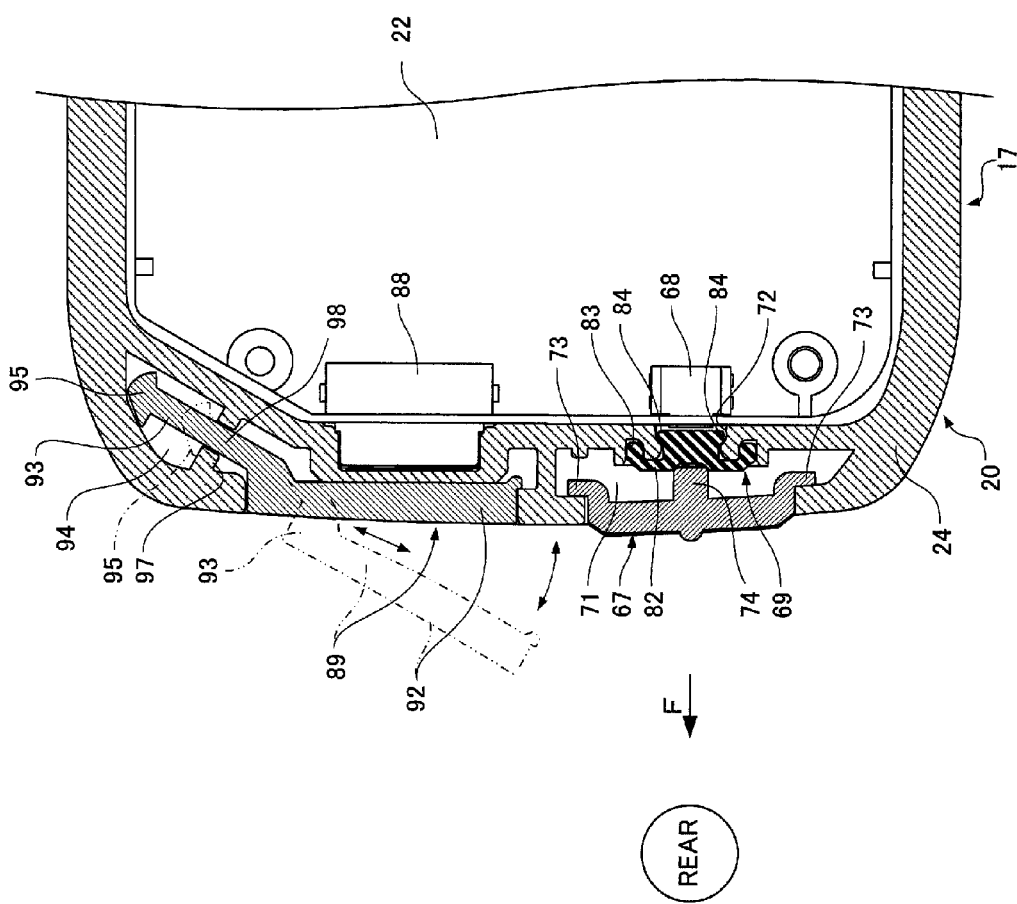
FIG. 20 is a view on arrow taken along line X-X of FIG. 19.

As shown in FIGS. 2 to 4, the display member 17 has a power operation button 67 for turning on and off a power supply. As shown in FIGS. 18 to 20, the first case 20 contains a tact switch 68 (an example of a change-over switch) serving as a power switch. The tact switch 68 is attached to the first circuit board 22. The operation button 67 is provided to operate the tact switch 68 from the outside. Furthermore, the first case 20 contains a waterproof member 69 that elastically seals a gap between the operation button 67 and the tact switch 68.

The first case 20 has a button mounting hole 71 and a waterproof-member mounting hole 72. The button mounting hole 71 is opened outside the first case 20. The button mounting hole 71 and the first case 20 internally communicate to each other through the waterproof-member mounting hole 72. The operation button 67 is removably fit into the button mounting hole 71.

Figure 21:
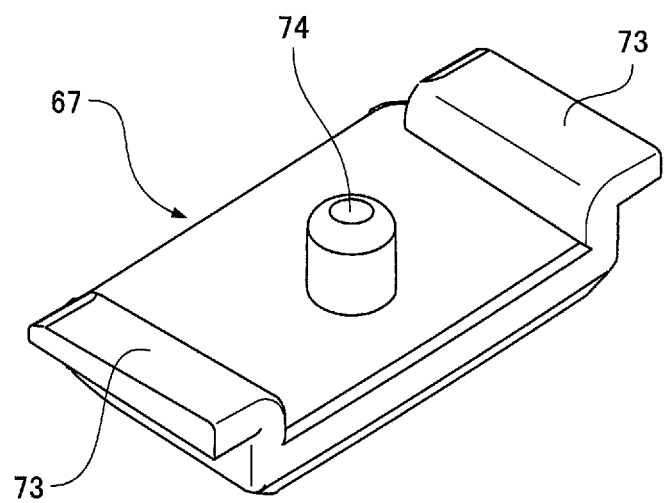
FIG. 21 is a perspective view showing an operation button for the display device according to an embodiment of the present invention.

As shown in FIG. 21, the operation button 67 has locking portions 73 on both sides and a protrusion 74 on the backside. As shown in FIG. 20, both of the locking portions 73 are locked into the first case 20 from the inside of the button mounting hole 71, thereby preventing the operation button 67 from falling out of the button mounting hole 71.

Figure 22A:
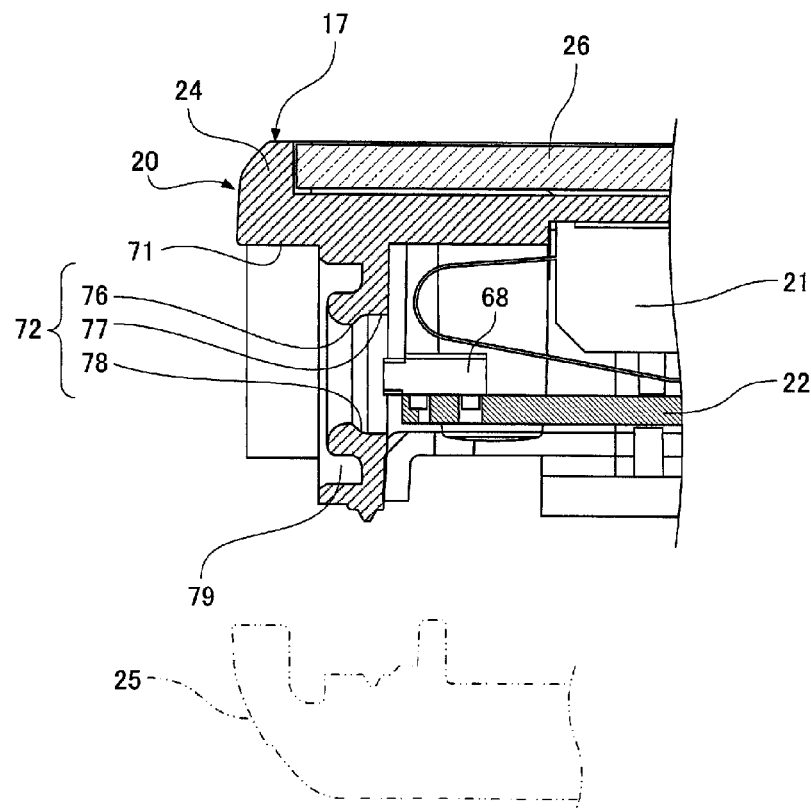
FIGS. 22(a) and 22(b) are longitudinal sections showing the steps of assembling the display member of the display device according to an embodiment of the present invention.

As shown in FIG. 22(a), the waterproof-member mounting hole 72 has a small diameter portion 76 and a large diameter portion 77. The large diameter portion 77 is formed behind the small diameter portion 76 and is opened in the first case 20. At the boundary between the small diameter portion 76 and the large diameter portion 77, a stepped portion 78 is formed so as to gradually decrease in diameter from the large diameter portion 77. Moreover, an annular groove 79 is formed radially outside the waterproof-member mounting hole 72. The groove 79 is opened on the button mounting hole 71

Figure 23:
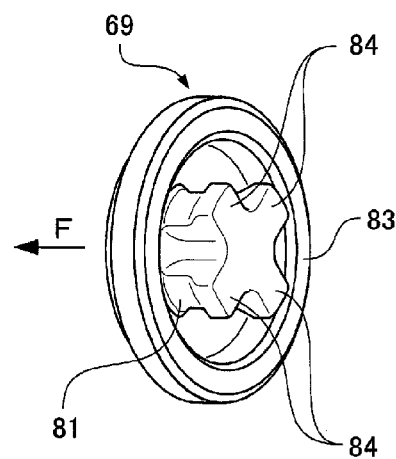
FIG. 23 is a perspective view showing the waterproof member of the display device according to an embodiment of the present invention.

The waterproof member 69 is detachably fit into the waterproof-member mounting hole 72 and transmits the operation of the operation button 67 to the tact switch 68. As shown in FIGS. 19 and 23, the waterproof member 69 is made of elastic materials such as rubber and has a circular body portion 81 and a flange portion 82 radially extending outward from the body portion 81. The flange portion 82 has a protrusion 83 to be fit into the groove 79. The body portion 81 has a plurality of anti-slip portions 84 that radially protrude outward.

The anti-slip portions 84 are disposed at four points spaced every 90° in the circumferential direction of the body portion 81. Moreover, the outside diameter of the anti-slip portion 84 is larger than the hole diameter of the small diameter portion 76 of the waterproof-member mounting hole 72 and is smaller than the hole diameter of the large diameter portion 77. The anti-slip portions 84 can be locked into the stepped portion 78 of the waterproof-member mounting hole 72 in a removing direction F of the waterproof member 69. The inner surface of the groove 79 and the protrusion 83 of the waterproof member 69 are bonded to each other with an adhesive.

Figure 25:
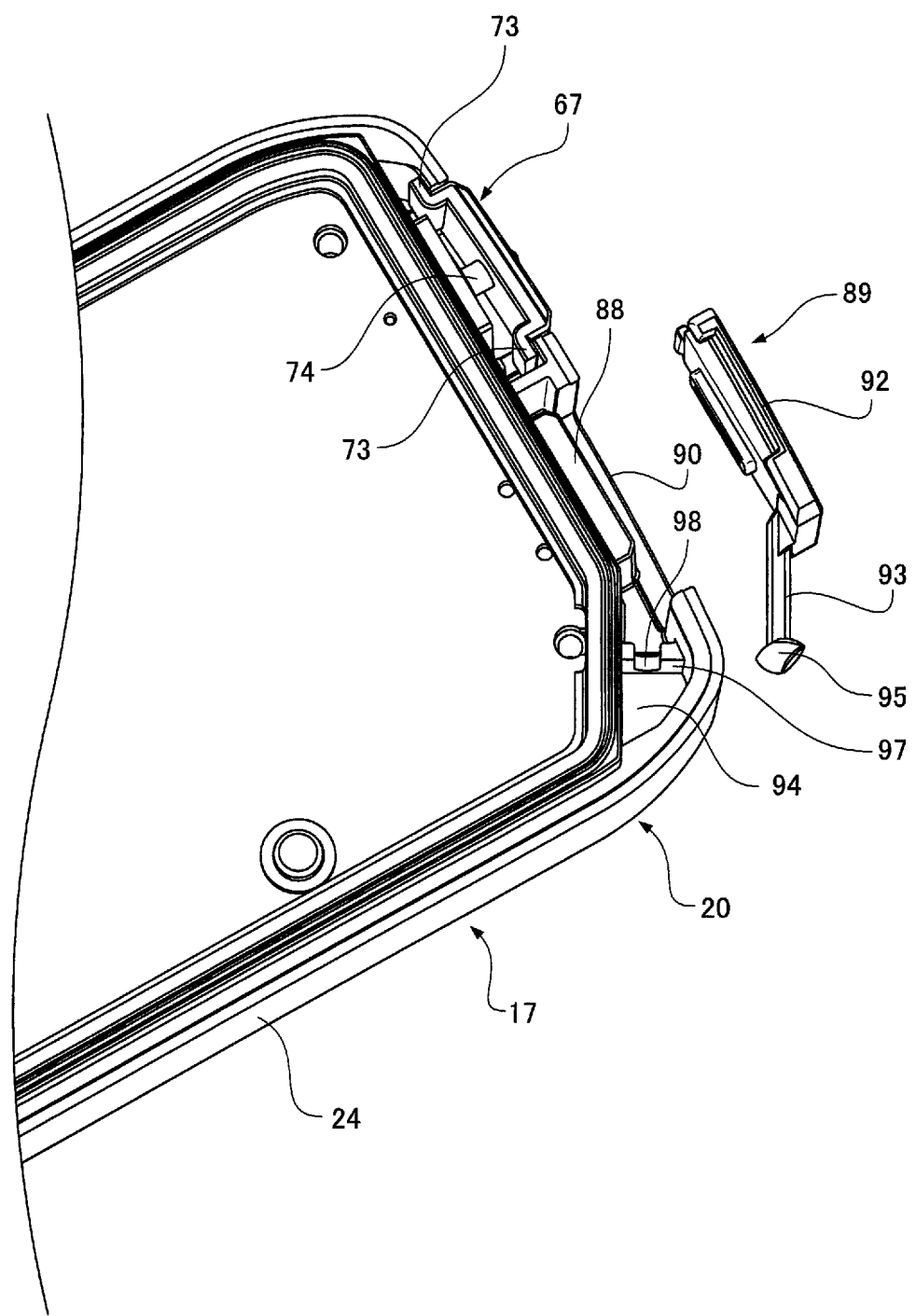
FIG. 25 is a perspective view showing the cap and the installation point of the cap when the display member of the display device is removed from the display member of the display device according to an embodiment of the present invention.

As shown in FIGS. 2 and 20, the display member 17 has a USB port 88 (an example of an external connection port) connectable to a personal computer (an example of another device). As shown in FIGS. 2 to 4 and 20, a reclosable cap 89 covering the USB port 88 is detachably provided on the first case 20. As shown in FIG. 25, the first case 20 has a port mounting opening 90 formed that faces the USB port 88.

Figure 24:
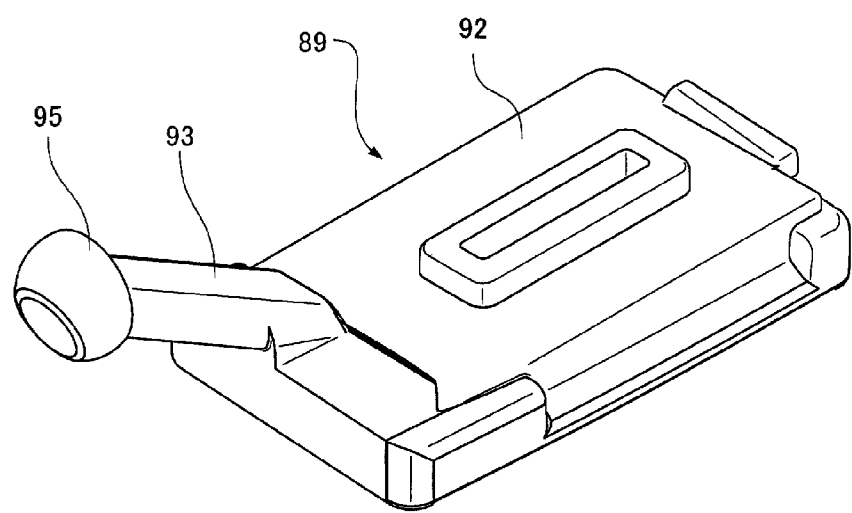
FIG. 24 is a perspective view showing a cap for the display member of the display device according to an embodiment of the present invention.

As shown in FIGS. 20, 24, and 25, the cap 89 is made of elastic materials such as rubber and has a main portion 92 shaped like a rectangular plate and an arm portion 93 provided on the main portion 92. The first case 20 contains a storage space 94 formed. As indicated by a solid line in FIG. 20, when the cap 89 is closed, the arm portion 93 is stored in the storage space 94. As indicated by a virtual line in FIG. 20, when the cap 89 is opened, the arm portion 93 can be drawn to the outside of the first case 20 from the storage space 94.

Figure 26:
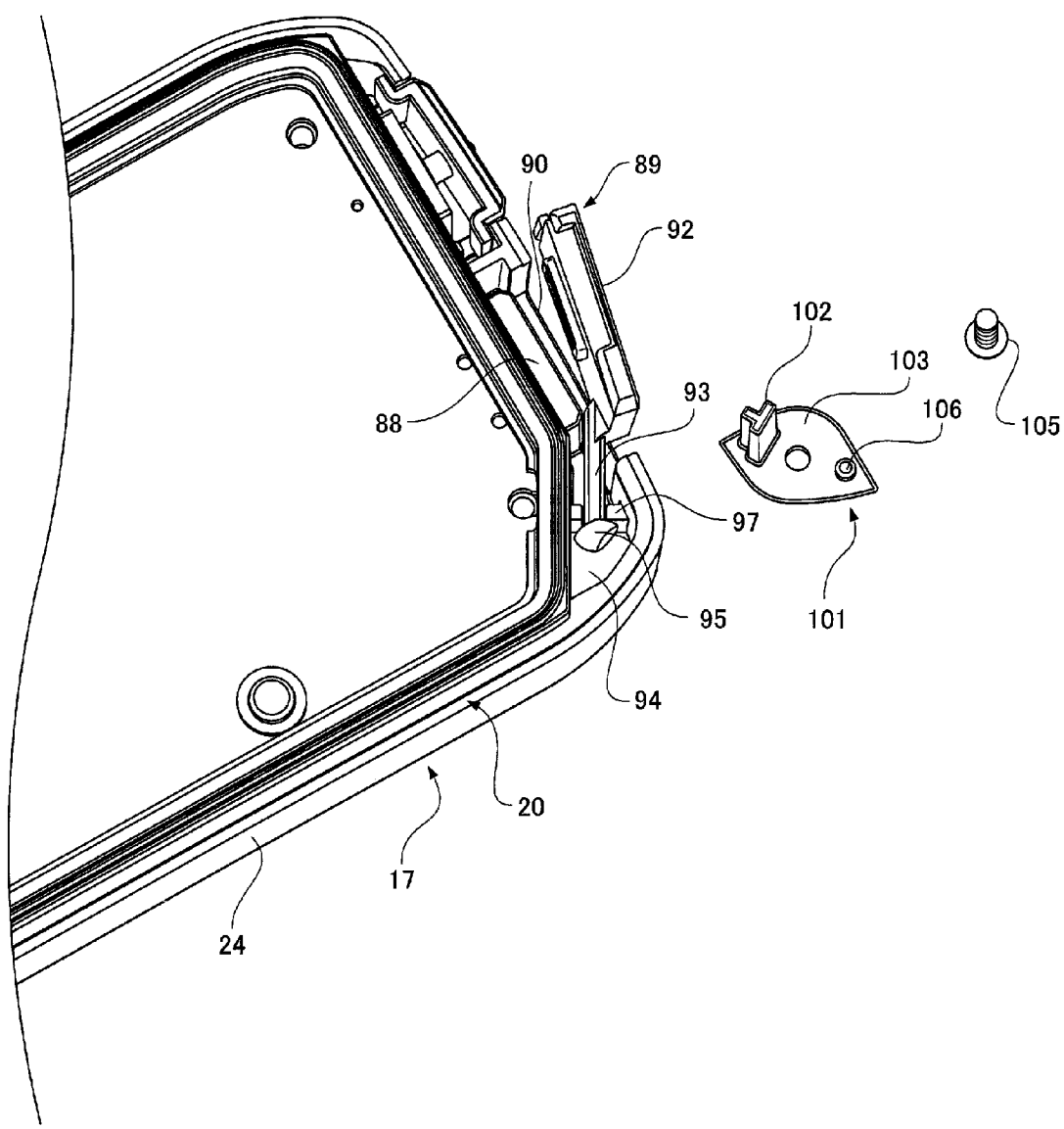
FIG. 26 is a perspective view showing the mounting structure of the cap for the display member of the display device and a removal preventing member according to an embodiment of the present invention.

A stopper portion 95 is provided on the distal end of the arm portion 93. The stopper portion 95 is larger in thickness and width than the arm portion 93. As shown in FIGS. 25 and 26, the storage space 94 contains a regulating plate 97 (an example of a regulating member). The regulating plate 97 has a notch 98 formed that is opened downward. The arm portion 93 is removably inserted into the notch 98 from below. As shown in FIG. 26, engagement of the stopper portion 95 with the regulating plate 97 regulates the drawing amount of the arm portion 93 to a predetermined drawing amount.

Figure 27:
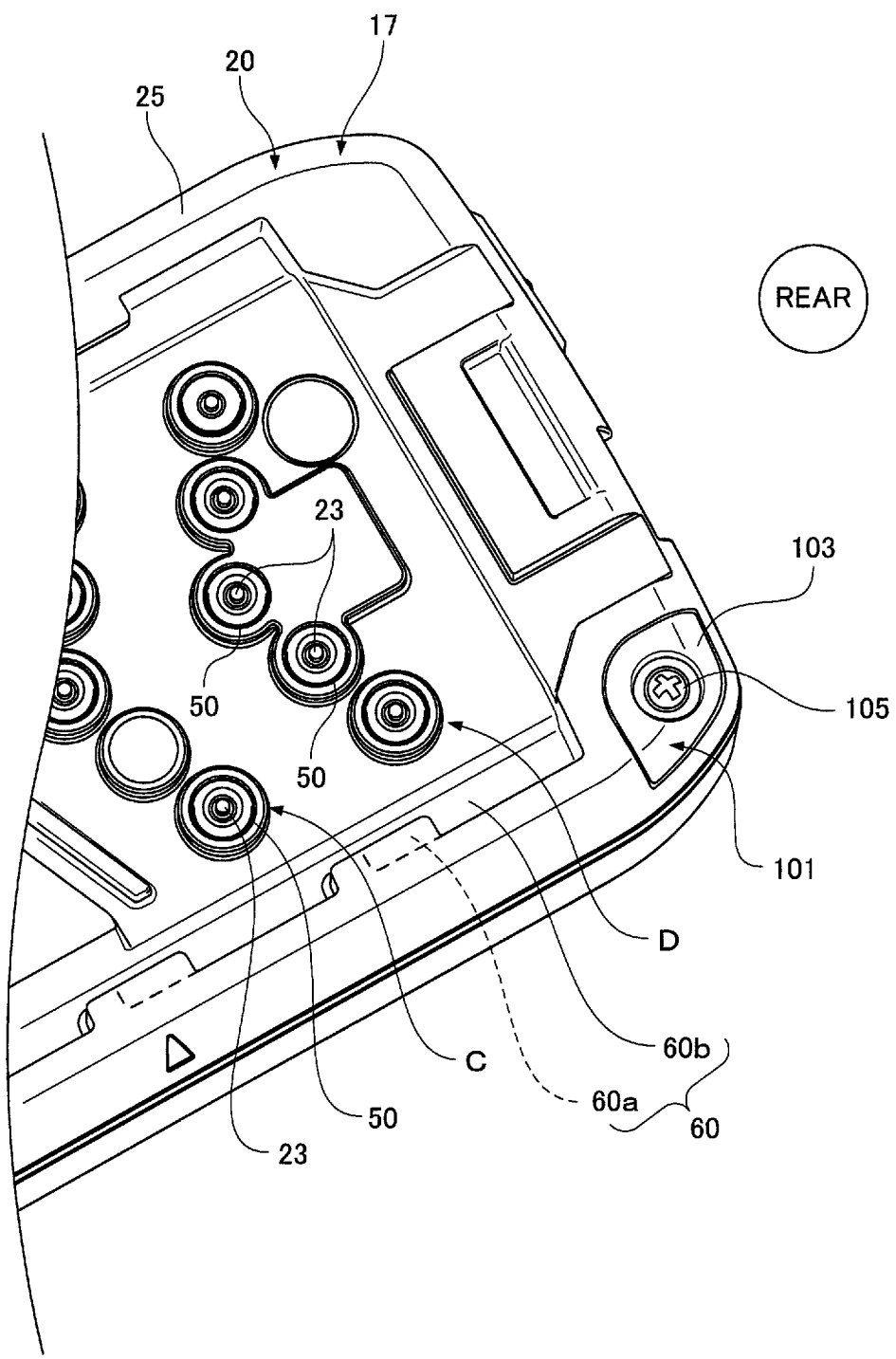
FIG. 27 is a perspective view showing the display member of the display device from the bottom with the attached removal preventing member according to an embodiment of the present invention.
Figure 28:
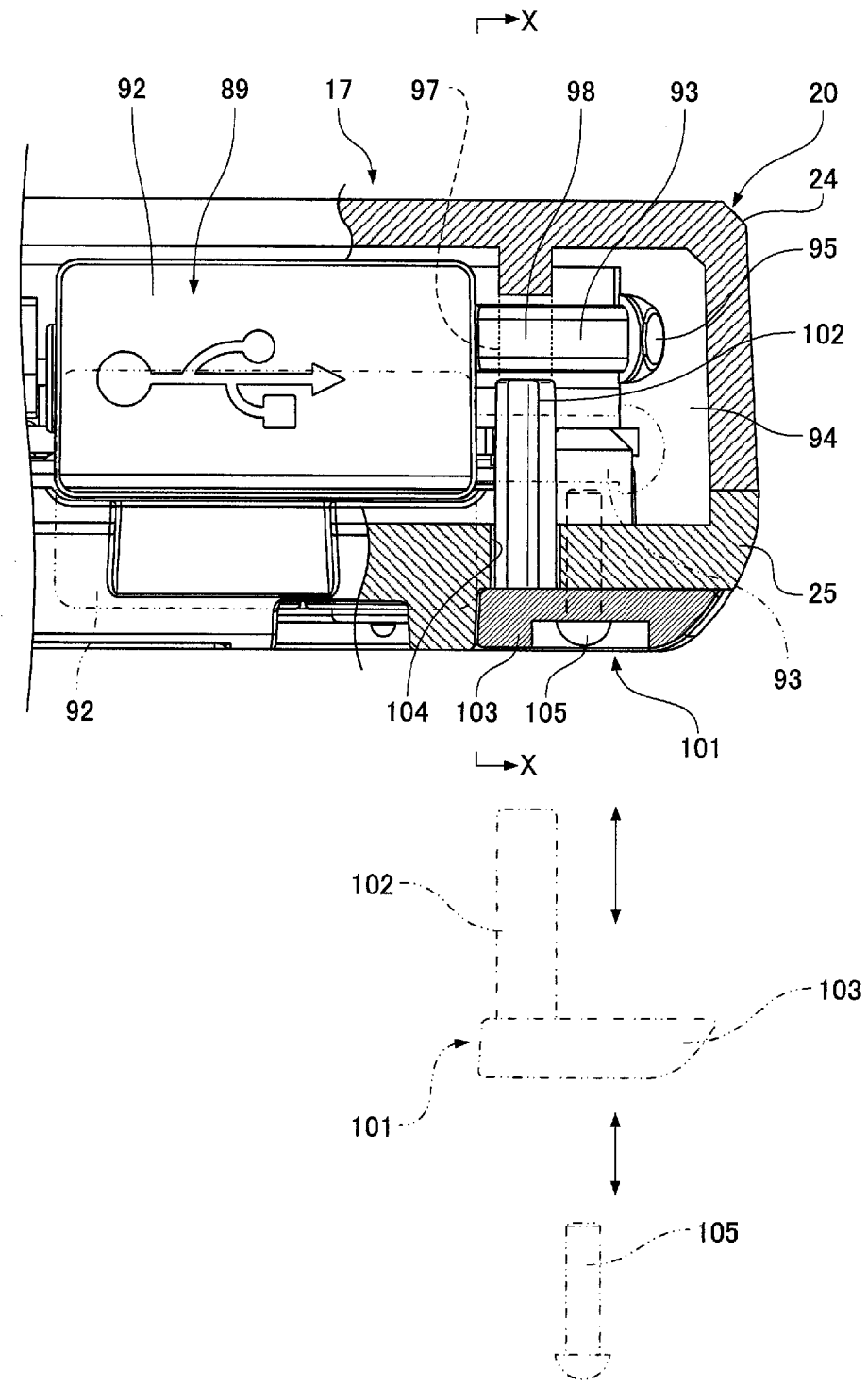
FIG. 28 is a longitudinal section showing the installation point of the cap for the display member of the display device according to an embodiment of the present invention.
Figure 29:
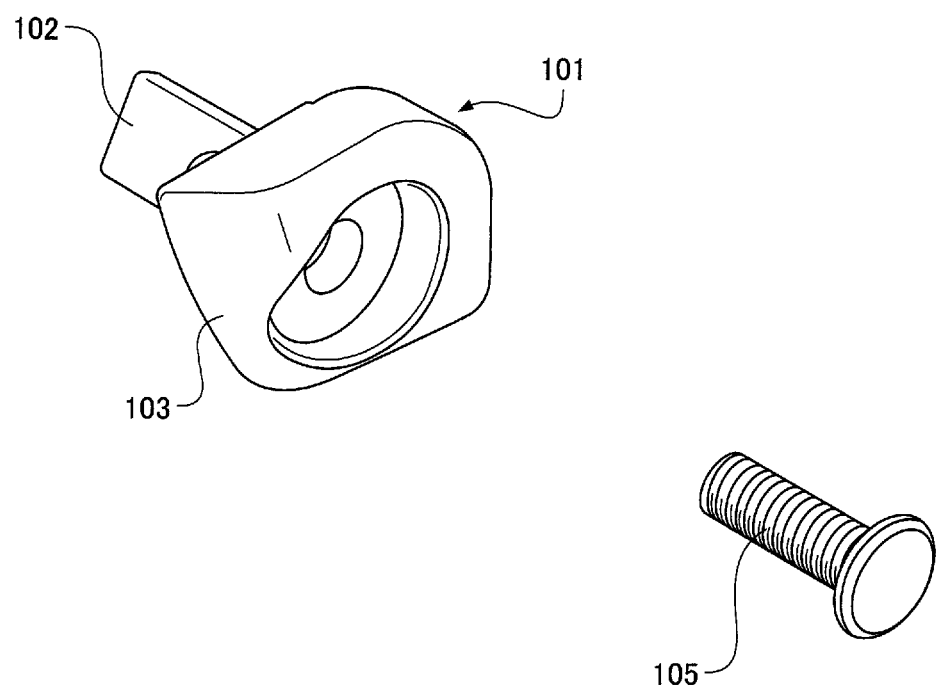
FIG. 29 is a perspective view showing the removal preventing member for the display member of the display device according to an embodiment of the present invention.
Figure 30:
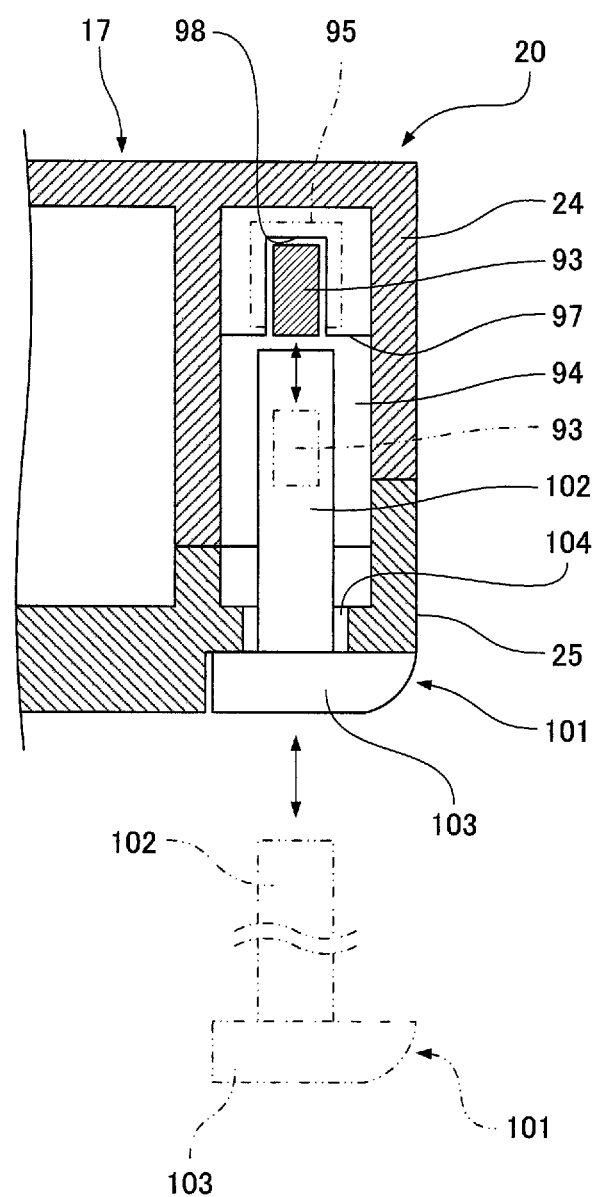
FIG. 30 is a view on arrow taken along line X-X of FIG. 28.

As shown in FIGS. 26 to 29, the first case 20 has a removal preventing member 101 that prevents the arm portion 93 from being removed downward from the notch 98. The removal preventing member 101 has a protruding portion 102 that is T-shaped in cross section and a mounting plate 103 provided on the protruding portion 102. As shown in FIG. 13, the first case 20 has a T-shaped through hole 104 formed. As shown in FIGS. 28 and 30, the protruding portion 102 is inserted into the through hole 104 from the outside of (below) the first case 20 and protrudes into the storage space 94. The distal end (upper end) of the protruding portion 102 faces the notch 98 of the regulating plate 97 from below, allowing the protruding portion 102 to prevent the arm portion 93 from being removed downward from the notch 98.

The mounting plate 103 is detachably attached to the first case 20 with a screw 105 from the outside. As shown in FIG. 27, the mounting plate 103 constitutes a corner of the first case 20. As shown in FIG. 26, the mounting plate 103 has a positioning protrusion 106 while as shown in FIG. 13, the first case 20 has a positioning hole 107. When the mounting plate 103 is attached to the first case 20, the positioning protrusion 106 is fit into the positioning hole 107 so as to accurately position the mounting plate 103.

As shown in FIG. 12, the second connecting terminal 38 constitutes a second connecting terminal 38a for the power supply and a second connecting terminal 38b for communications. Furthermore, as shown in FIG. 10, the first connecting terminal 23 constitutes a first connecting terminal 23a for the power supply and a first connecting terminal 23b for communications. The first connecting terminal 23a comes into contact with or separates from the second connecting terminal 38a for the power supply, and the first connecting terminal 23b comes into contact with or separates from the second connecting terminal 38b for communications. The second connecting terminal 38a for the power supply receives a higher voltage than that of the second connecting terminal 38b for communications.

Figure 31:
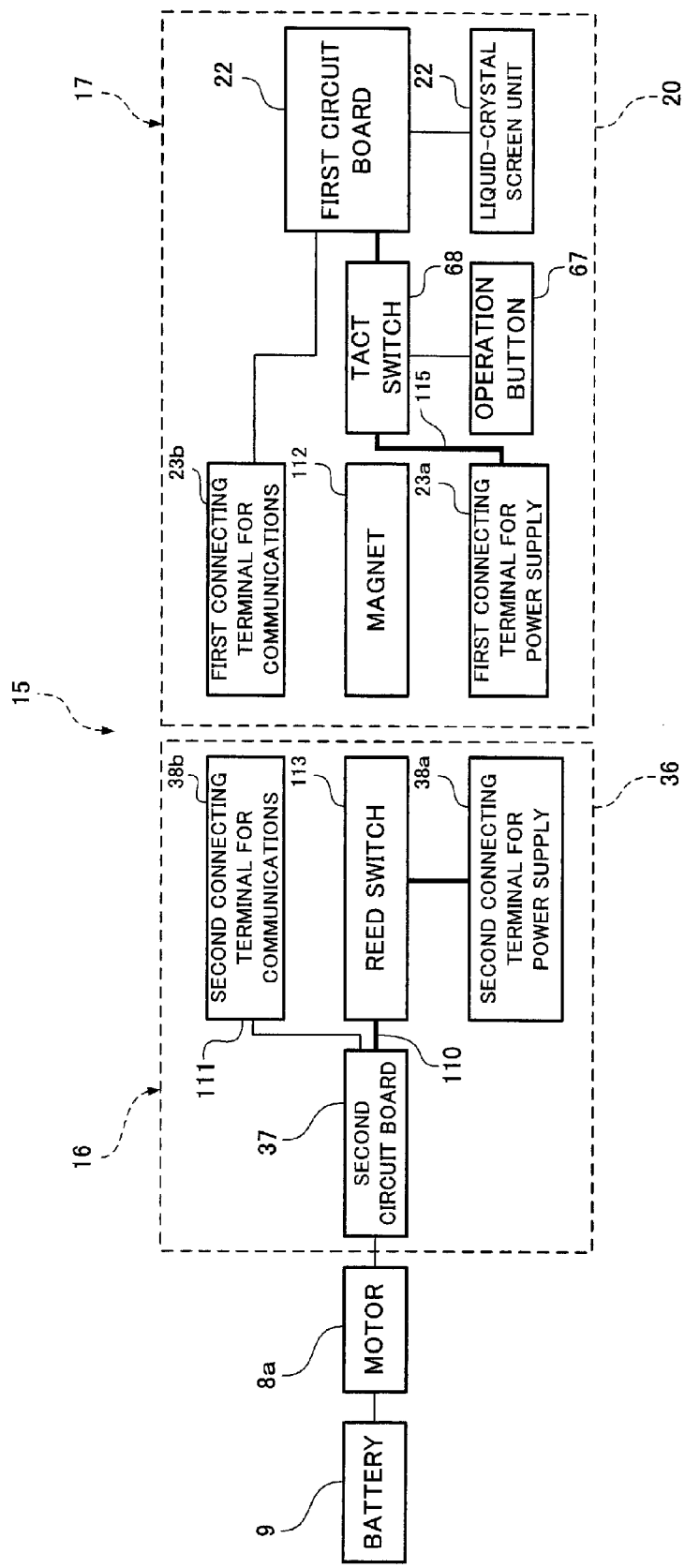
FIG. 31 is a block diagram showing the electrical system of the display device according to an embodiment of the present invention.

As shown in FIG. 31, the second circuit board 37 and the second connecting terminal 38a for the power supply are electrically connected to each other via a power supply line 110. The second circuit board 37 and the second connecting terminal 38b for communications are electrically connected to each other via a communication line 111.

As shown in FIGS. 6 and 31, the first case 20 of the display member 17 contains a magnet 112 (an example of a magnetic-field generating member). The second case 36 of the supporting member 16 contains a reed switch 113 that connects and disconnects the power supply line 110 in response to a magnetic field generated from the magnet 112. The reed switch 113 is provided on the way of the power supply line 110.

When the display member 17 is attached to the supporting member 16 as shown in FIG. 3, the magnet 112 is located directly above the reed switch 113 as shown in FIG. 6, applying the magnetic field of the magnet 112 to the reed switch 113 so as to close the contact point of the reed switch 113. As shown in FIG. 4, when the display member 17 is detached from the supporting member 16, the magnetic field of the magnet 112 is not applied to the reed switch 113, opening the contact point of the reed switch 113.

The effect of the configuration will be discussed below.

When the display member 17 is attached to the supporting member 16 as shown in FIG. 3, the distal ends of the first connecting terminals 23 come into contact with the distal ends of the second connecting terminals 38 as shown in FIGS. 5 and 6, and a magnetic field generated from the magnet 112 in the display member 17 is applied to the reed switch 113 so as to close the contact point of the reed switch 113. This connects the power supply line 110. Subsequently, as shown in FIG. 19, a press on the operation button 67 in an inward direction G causes the protrusion 74 of the operation button 67 to elastically deform the waterproof member 69, and then the operation of the operation button 67 is transmitted to the tact switch 68 through the waterproof member 69 so as to turn on the tact switch 68. Thus, as shown in FIG. 31, the first connecting terminal 23a for the power supply and the first circuit board 22 are electrically connected to each other via a connecting line 115.

With this configuration, power stored in the battery 9 is supplied to the second connecting terminal 38a for the power supply from the second circuit board 37 through the power supply line 110 and then is supplied to the first circuit board 22 from the second connecting terminal 38a for the power supply through the first connecting terminal 23a for the power supply. This displays various kinds of traveling information on the liquid-crystal screen unit 21 of the display member 17.

Figure 32:
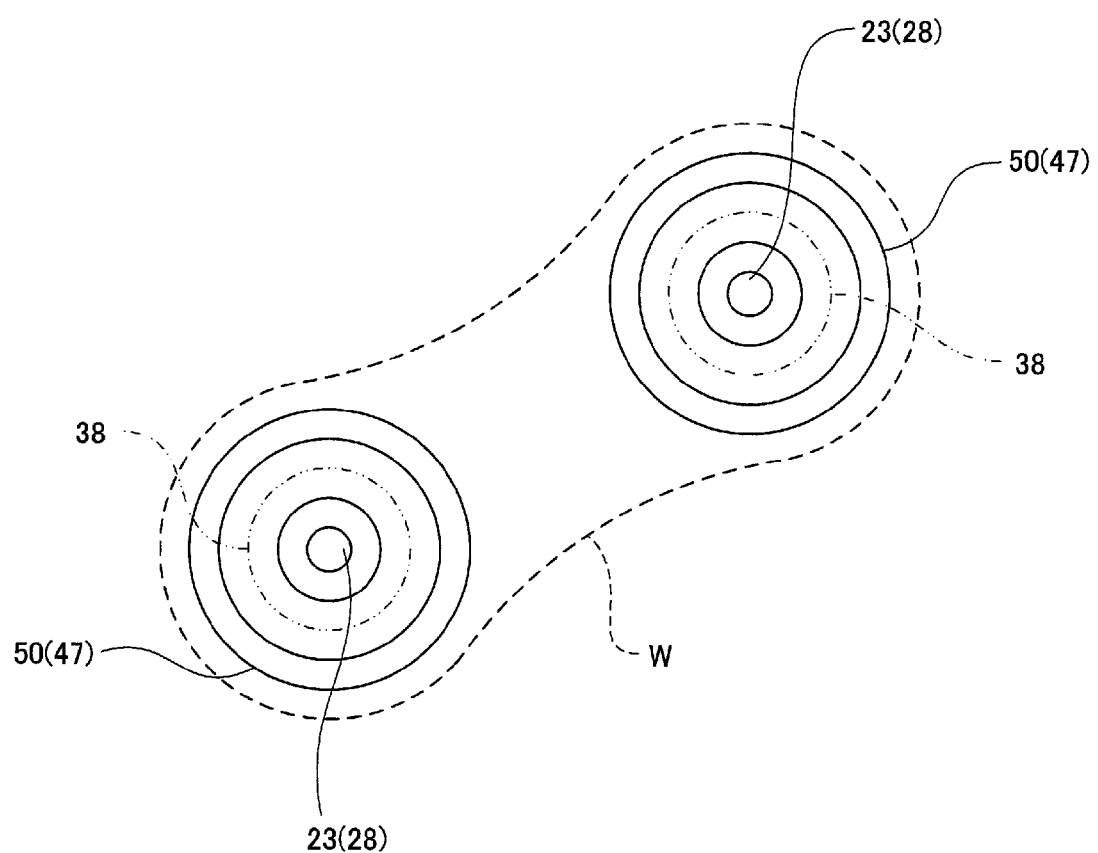
FIG. 32 shows a seal structure between the first and second connecting terminals of the display device according to an embodiment of the present invention.

When the display member 17 is attached to the supporting member 16, as shown in FIG. 8, the end protrusion 50 of the first seal member 47 is exposed from the first joint surface 31 and comes into contact with the second joint surface 40 so as to surround the distal end of the first connecting terminal 23 and the distal end of the second connecting terminal 38 in contact with the first connecting terminal 23 to each other. Thus, as shown in FIG. 32, the end protrusion 50 of the first seal member 47 seals a gap between the distal ends of the first and the adjacent first connecting terminals 23 and also seals a gap between the distal ends of the second and the adjacent second connecting terminals 38.

If the water W such as rainwater enters a gap between the first joint surface 31 of the display member 17 and the second joint surface 40 of the supporting member 16, this configuration can prevent the water W from coming into contact with the distal ends of the first and the adjacent first connecting terminals 23, and prevent the water W from coming into contact with the distal ends of the second and the adjacent second connecting terminals.

Thus, electrolytic etching of the first and second connecting terminals 23 and 38 can be prevented by a potential difference between the first and the adjacent first connecting terminals 23 or a potential difference between the second and the adjacent second connecting terminals 38, thereby preventing the occurrence of defective operations and poor communications.

When the display member 17 is attached to the supporting member 16 as shown in FIG. 3, the first drain wall 55 is located directly above the second drain wall 56 as shown in FIG. 6. If the water W enters a gap between the first joint surface 31 and the second joint surface 40 from the front in the traveling direction, as shown in FIGS. 10 and 12, the water W flows along the first and second drain walls 55 and 56 so as to be guided in a lateral direction and then is laterally discharged to the outside from a gap between the display member 17 and the supporting member 16.

Moreover, even if the water W in the gap between the first joint surface 31 and the second joint surface 40 passes through a small gap between the first drain wall 55 and the second drain wall 56 from the front to the rear, the passed water W flows into the drain grooves 58 and 59, is guided in a lateral direction through the drain grooves 58 and 59, and then is laterally discharged to the outside from the gap between the display member 17 and the supporting member 16.

This configuration can prevent the water W from being retained in the gap between the first joint surface 31 and the second joint surface 40, thereby further preventing electrolytic etching of the first and second connecting terminals 23 and 38 and the occurrence of defective operations.

As shown in FIG. 3, when the electric bicycle 1 travels with the display member 17 attached to the supporting member 16, the distal end of the first connecting terminal 23a for the power supply and the distal end of the second connecting terminal 38a for the power supply may be momentarily separated from each other by vibrations and so on. Even in this case, as shown in FIG. 31, the contact point of the reed switch 113 is closed to keep the connection of the power supply line 110, thereby reliably supplying the power of the battery 9 from the second circuit board 37 to the first circuit board 22 through the first and second connecting terminals 23a and 38a for the power supply. This configuration does not accidentally interrupt the power supply of the liquid-crystal screen unit 21 of the display member 17.

As shown in FIG. 4, when the display member 17 is slid in the detaching direction B so as to be removed from the supporting member 16, a magnetic field generated from the magnet 112 in the display member 17 is not applied to the reed switch 113. This opens the contact point of the reed switch 113 and interrupts the power supply line 110. Thus, power supply from the battery 9 to the second connecting terminal 38a for the power supply is interrupted so as to prevent loading of a high voltage of the battery 9 to the second connecting terminal 38a for the power supply. This can prevent electrolytic etching of the second connecting terminal 38a for the power supply. Even if a hand of a person comes into contact with the distal end of the second connecting terminal 38a for the power supply, an electric shock can be avoided to obtain safety.

As indicated by virtual lines in FIG. 4 and the virtual line in FIG. 20, the cap 89 of the display member 17 detached from the supporting member 16 is opened to expose the USB port 88 and then one end of a USB cable is inserted into the USB port 88, thereby connecting the display member 17 to a personal computer via the USB cable. Subsequently, the personal computer is operated to analyze various kinds of traveling information stored in the memory of the display member 17. This can determine the presence or absence of an abnormality of the motor 8a or the like.

When the cap 89 is opened, the arm portion 93 is drawn out of the first case 20 with the turning cap 89, facilitating the opening of the cap 89. At this point, as indicated by the virtual line in FIG. 20 and shown in FIG. 26, the engagement of the stopper portion 95 with the regulating plate 97 regulates the drawing amount of the arm portion 93 to the predetermined drawing amount. This can prevent the arm portion 93 from being removed out of the first case 20.

In replacement of the cap 89, as indicated by virtual lines in FIG. 28 and virtual lines in FIG. 30, the screw 105 is removed, the protruding portion 102 is drawn downward from the through hole 104 (FIG. 13), and then the removal preventing member 101 is removed from the first case 20. Thus, as indicated by the virtual lines in FIG. 28 and the virtual lines in FIG. 30, the arm portion 93 can be separated downward from the notch 98 of the regulating plate 97. In this way, the removal of the arm portion 93 from the notch 98 can release the restriction on the drawing amount of the arm portion 93 and thus the arm portion 93 can be drawn out of the first case 20. This can remove the cap 89, as shown in FIG. 13, from the first case 20 without disassembling the first case 20 into the upper case unit 24 and the lower case unit 25.

After that, as shown in FIG. 28, the arm portion 93 of another cap 89 is inserted into the storage space 94 from the outside of the first case 20 and then is inserted into the notch 98 from below as indicated by solid lines in FIG. 30. Subsequently, the protruding portion 102 is inserted into the through hole 104 (FIG. 13) and then the removal preventing member 101 is fastened to the first case 20 with the screw 105. Thus, the another cap 89 can be attached to the first case 20 without disassembling the first case 20 into the upper case unit 24 and the lower case unit 25. Since the removal preventing member 101 can be attached and detached from the outside of the first case 20, the replacement of the cap 89 does not need disassembly of the first case 20 into the upper case unit 24 and the lower case unit 25, facilitating the replacement of the cap 89.

Figure 17:
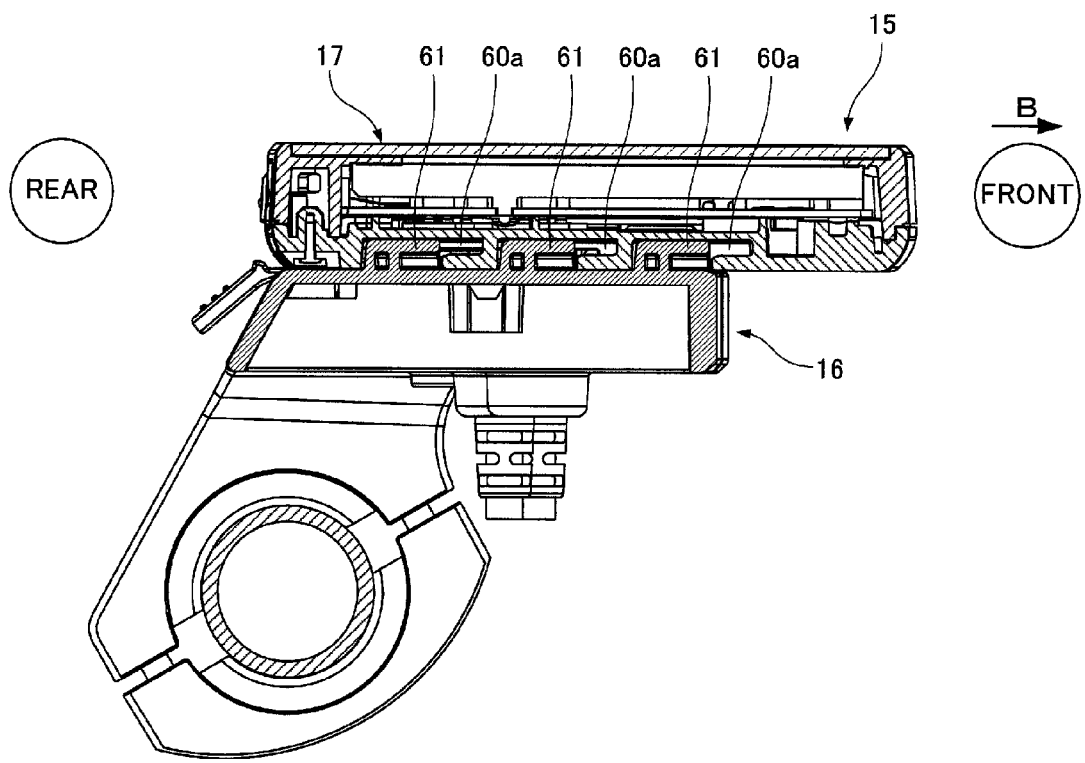
FIG. 17 is a longitudinal section when the display member of the display device is slid in a detaching direction relative to the supporting member according to an embodiment of the present invention.

When the display member 17 is attached to the supporting member 16, the display member 17 is moved down to the supporting member 16 as shown in FIGS. 4 and 14, the engaging claws 61 of the supporting member 16 are inserted into the opening portions 60b of the engaging holes 60 of the display member 17 from below as shown in FIGS. 16 and 17, and then the display member 17 is slid in the attaching direction A as shown in FIG. 15 and indicated by the virtual lines in FIG. 16. Thus, the engaging claws 61 are inserted into the insertion hole portions 60a from the opening portions 60b of the engaging holes 60 so as to engage the engaging holes 60 with the engaging claw 61. This attaches the display member 17 to the supporting member 16.

After the display member 17 is thus attached to the supporting member 16, as indicated by a virtual line in FIG. 5, the screw 63 is inserted into the screw hole 65 of the supporting member 16 from below and is threaded into the nut member 64. This can fix the display member 17 to the supporting member 16.

When the display member 17 is to be detached from the supporting member 16, as indicated by solid lines in FIG. 5 and virtual lines in FIG. 6, the screw 63 is first removed from the nut member 64, releasing fixing of the display member 17 to the supporting member 16. After that, as indicated by solid lines in FIG. 16 and shown in FIG. 17, the display member 17 is slid in the detaching direction B so as to remove the engaging claws 61 from the insertion hole portions 60a to the opening portions 60b, and then as shown in FIGS. 4 and 14, the display member 17 is lifted from the supporting member 16 so as to remove the engaging claws 61 downward from the supporting member 16. Thus, the engaging holes 60 and the engaging claws 61 are separated from each other, detaching the display member 17 from the supporting member 16.

The pairs of engaging holes 60 and engaging claws 61 are provided in the attaching and detaching directions A and B. Thus, in the attachment and detachment of the display member 17 to and from the supporting member 16, the sliding distance of the display member 17 in the attaching and detaching directions A and B can be shortened.

When the display member 17 is slid in the attaching direction A relative to the supporting member 16 so as to be attached to the supporting member 16, the end protrusions 50 of the first seal members 47 move in the attaching direction A while sliding in contact with the second joint surface 40 and the distal ends of the second connecting terminals 38, allowing the end protrusions 50 of the first seal members 47 to scrape off deposits such as dust adhered on the second joint surface 40 and the distal ends of the second connecting terminals 38. This cleans the distal ends of the second connecting terminals 38.

Figure 33:
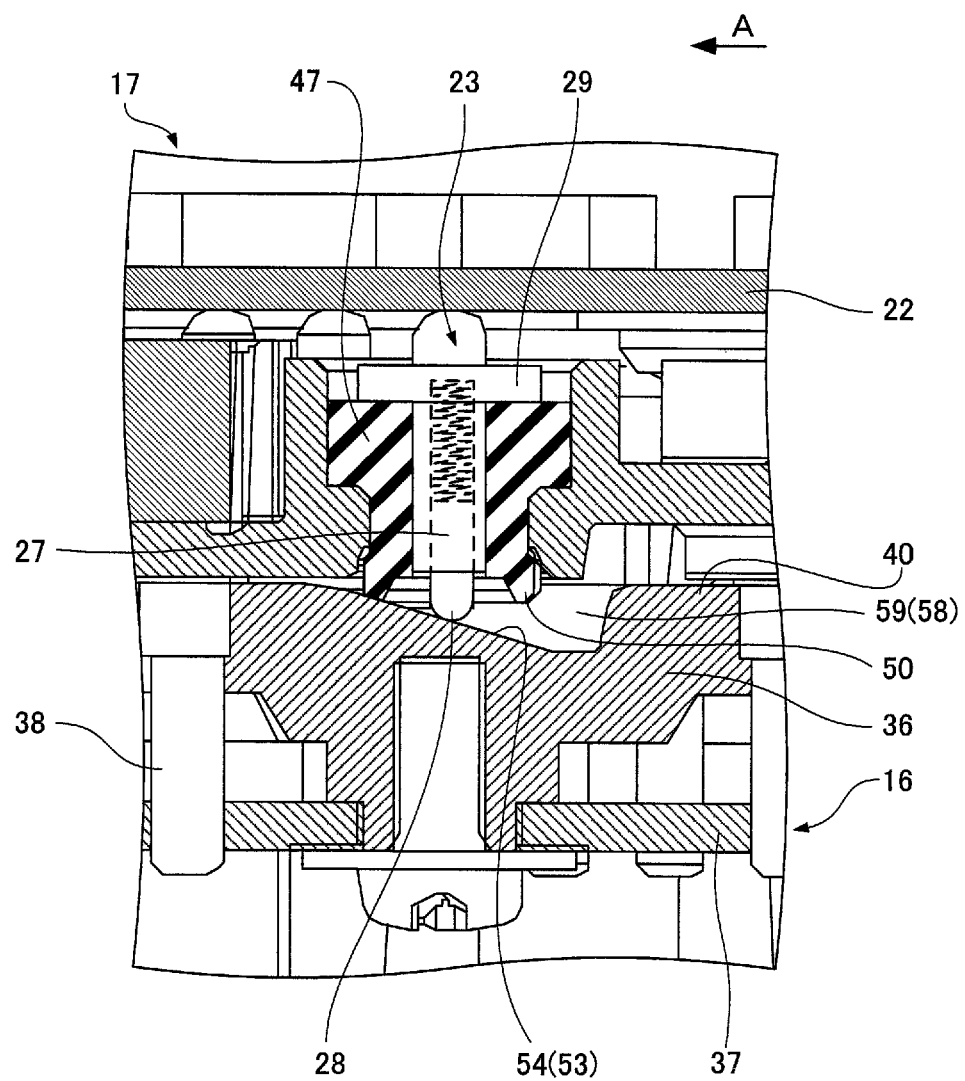
FIG. 33 is an enlarged longitudinal section showing that the display member of the display device is slid in an attaching direction relative to the supporting member such that the first connecting terminal passes over the drain groove according to an embodiment of the present invention.
Figure 34:
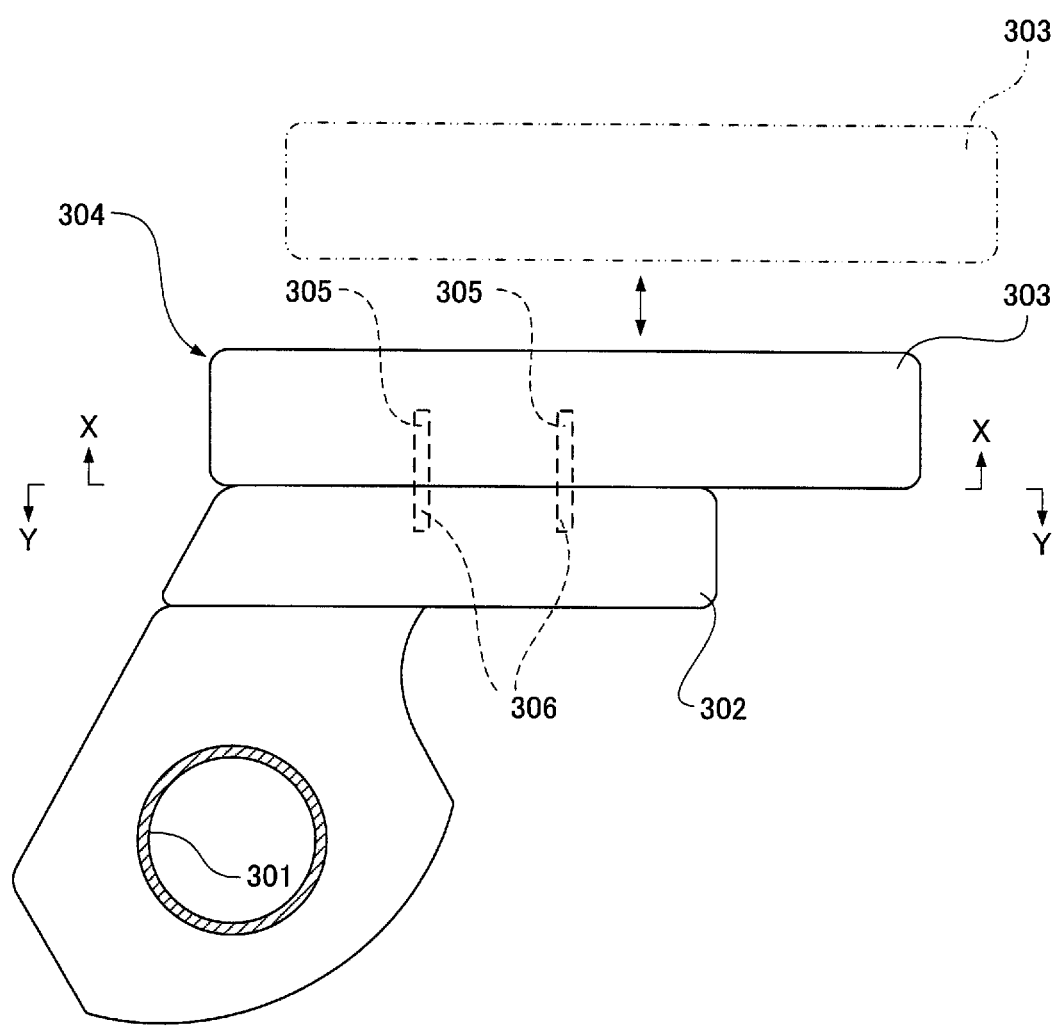
FIG. 34 is a side view of a conventional display device.
Figure 35:
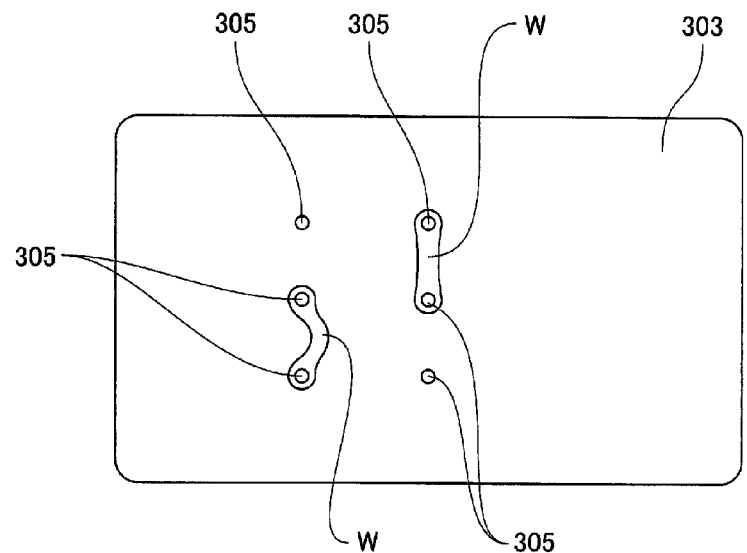
FIG. 35 is a view on arrow taken along line X-X of FIG. 34.
Figure 36:
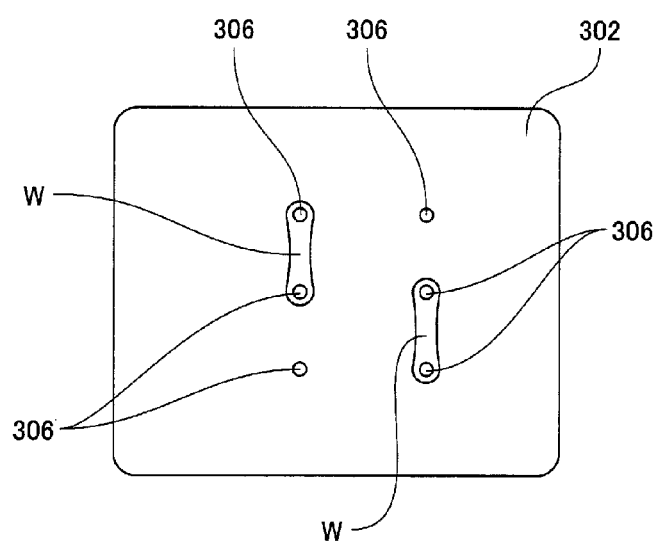
FIG. 36 is a view on arrow taken along line Y-Y of FIG. 34.

As shown in FIG. 33, when the first connecting terminals 23 move in the attaching direction A above the drain grooves 58 and 59, the pins 28 of the first connecting terminals 23 are guided upward in sliding contact with the inclined surfaces 53 and 54 of the drain grooves 58 and 59. Thus, the first connecting terminals 23 smoothly move above the drain grooves 58 and 59 and come into contact with the second connecting terminals 38 as shown in FIGS. 6 and 8.

Figure 22B:
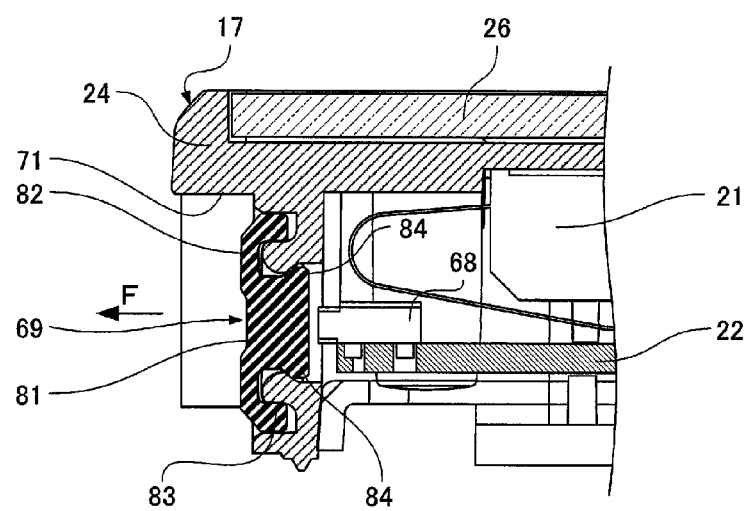

In the assembly of the display member 17, as shown in FIG. 22(a), an adhesive is applied into the groove 79 of the upper case unit 24 while the first case 20 of the display member 17 is divided into the upper case unit 24 and the lower case unit 25. As shown in FIG. 22(b), the body portion 81 of the waterproof member 69 is fit into the waterproof-member mounting hole 72 from the outside, and then the protrusion 83 of the waterproof member 69 is fit into the groove 79 from the outside and is bonded to the inner surface of the groove 79. When the protrusion 83 is bonded, the anti-slip portion 84 of the waterproof member 69 is locked to the stepped portion 78 of the waterproof-member mounting hole 72 in the removing direction F of the waterproof member 69. This prevents the position of the waterproof member 69 from shifting to the outside of the waterproof-member mounting hole 72 (i.e., in the removing direction F), attaching the waterproof member 69 to a correct position with an adhesive.

After that, as shown in FIG. 19, the operation button 67 is fit into the button mounting hole 71 and the upper case unit 24 is connected to the lower case unit 25, assembling the display member 17.

In the present embodiment, as shown in FIG. 8, the terminal mounting hole 42 is formed on the first case 20, the first connecting terminal 23 is inserted into the terminal mounting hole 42, the first seal member 47 is provided on the first case 20, and the distal end of the first seal member 47 is exposed to the first joint surface 31 and comes into contact with the second joint surface 40. The terminal mounting hole 42 may be formed on the second case 36, the second connecting terminal 38 may be inserted into the terminal mounting hole 42, the second seal member 52 may be provided on the second case 36 so as to seal a gap between the second connecting terminal 38 and the terminal mounting hole 42, and the distal end of the second seal member 52 may be exposed on the second joint surface 40 and come into contact with the first joint surface 31.

In the present embodiment, as shown in FIGS. 4 and 13, three pairs of the engaging holes 60 or claws 61 are provided in the attaching and detaching directions A and B (longitudinal direction). The number of pairs may be changed.

In the present embodiment, as shown in FIG. 4, the display device 15 includes the display member 17 detachable from the supporting member 16. Instead of the detachable configuration, the display member 17 and the supporting member 16 of the display device may be integrated to each other.

In the present embodiment, the first drain wall 55 is provided on the display member 17 as shown in FIG. 10 and the second drain wall 56 is provided on the supporting member 16 as shown in FIG. 12. Alternatively, only the second drain wall 56 may be provided without providing the first drain wall 55 or only the first drain wall 55 may be provided without providing the second drain wall 56.

In the present embodiment, as shown in FIG. 1, the electric bicycle was described as an example of a vehicle. An ordinary bicycle not provided with the electric auxiliary drive unit 8 may be applied instead.

Alternatively, a vehicle other than a bicycle, for example, a motorcycle or a wheelchair may be applied instead.

The invention claimed is:

1. A display device attached to a vehicle, comprising:
a supporting member attached to a fixing member of the vehicle; and
a display member detachably joined to the supporting member,
wherein the display member includes a first case, a first circuit board stored in the first case, and a plurality of first connecting terminals electrically connected to the first circuit board,
the supporting member includes a second case, a second circuit board stored in the second case, and a plurality of second connecting terminals electrically connected to the second circuit board,
the first case has a first joint surface that is joined to the second case,
the second case has a second joint surface that is joined to the first joint surface of the first case,
the first connecting terminal has a distal end that is exposed on the first joint surface and comes into contact with a distal end of the second connecting terminal when the display member is attached to the supporting member,
one of the first and second cases has a plurality of terminal mounting holes,
the terminal mounting hole has a large diameter portion, a small diameter portion, and a stepped surface formed at a boundary between the large diameter portion and the small diameter portion,
one of the first and second connecting terminals is inserted into the terminal mounting hole,
one of the cases includes a seal member that seals a gap between the one of the connecting terminals and the terminal mounting hole, and
the seal member has an expanded portion radially extending outward, and an end protrusion,
the expanded portion of the seal member is fit into the large diameter portion of the terminal mounting hole,
the end protrusion of the seal member is exposed on one of the first joint surface and the second joint surface, comes into contact with the other joint surface, and surrounds the distal ends of the first and second connecting terminals in contact to each other.

2. The display device for a vehicle according to claim 1, wherein the one of the cases is the first case,
the one of the connecting terminals is the first connecting terminal,
the one of the joint surfaces is the first joint surface, and the other joint surface is the second joint surface.

3. The display device for a vehicle according to claim 1, wherein the display member slides in attaching and detaching directions along the first and second joint surfaces so as to be attached to and detached from the supporting member, and
at least one of the first and second cases has a draining member that guides water entering a gap between the first joint surface and the second joint surface from a front of the display device in the attaching and detaching directions of the display member in a lateral direction to laterally discharge the water to the outside of the display device for a vehicle,
the draining, member being disposed in front of the first and second connecting terminals in a traveling direction.

4. The display device for a vehicle according to claim 1, wherein the display member has first engaging portions,
the supporting member has second engaging portions,
the first engaging portions are engaged with the second engaging portions in an attaching direction along which the display member is attached to the supporting member, and are detached from the second engaging portions in a detaching direction along which the display member is detached from the supporting member, and
the first and second engaging portions are provided in pairs in the attaching and detaching directions.

5. The display device for a vehicle according to claim 1, wherein the display member is capable of being fixed to the supporting member with a detachable fastener.

6. The display device for a vehicle according claim 1. wherein the first case contains a change-over switch,
the first case has an operation button for externally operating the change-over switch,
the first case contains a waterproof member that elastically seals a gap between the change-over switch and the operation button,
the first case has a button mounting hole and a waterproof-member mounting hole formed, the button mounting hole and the first case internally communicate to each other through the waterproof-member mounting hole, the operation button is removably fit into the button mounting hole, the waterproof member is detachably fit into the waterproof-member mounting hole and transmits an operation of the operation button to the change-over switch, and the waterproof member has an anti-slip portion formed that prevents a position of the waterproof member fit into the waterproof-member mounting hole from shifting to outside of the waterproof-member mounting hole during assembly.

7. The display device for a vehicle according to claim 1, wherein the display member has an external connection port that is connectable to other devices, the first case has a reclosable cap that detachably covers the external connection port, the cap has an arm portion that is inserted into the first case, the arm portion is inserted into the first case when the cap is closed, the arm portion is capable of being drawn from the first case when the cap is opened, the arm portion has a stopper portion, the first case contains a regulating member, the regulating member has a notch formed, the arm portion is detachably inserted into the notch, the stopper portion is engaged with the regulating member so as to regulate a drawing amount of the arm portion to a predetermined drawing amount, the first case has a removal preventing member that prevents the arm portion from being detached from the notch, and the removal preventing member is externally attachable and detachable to and from the first case.

8. The display device for a vehicle according to claim 1, wherein the second connecting terminal has a second connecting terminal for a power supply and a second connecting terminal for communications, the second connecting terminal for the power supply receives a higher voltage than a voltage of the second connecting terminal for communications, the second circuit board and the second connecting terminal for the power supply are electrically connected to each other via a power supply line, the second circuit board and the second connecting terminal for communications are electrically connected to each other via a communication line, the display member contains a magnetic-field generating member, the supporting, member contains a switch that connects and disconnects the power supply line in response to a magnetic field generated from the magnetic-field generating member, attachment of the display member to the supporting member closes a contact point of the switch, and detachment of the display member from the supporting member opens the contact point of the switch.

9. A bicycle comprising the display device for a vehicle according to claim 1.

* * * * *